(12) United States Patent
Tosaka et al.

(10) Patent No.: US 7,136,797 B2
(45) Date of Patent: Nov. 14, 2006

(54) METHOD OF AND APPARATUS FOR AUTOMATICALLY CORRECTING DEVICE MODEL, AND COMPUTER PRODUCT

(75) Inventors: Masaki Tosaka, Kawasaki (JP); Toshio Karino, Kawasaki (JP); Tatsuo Koizumi, Kawasaki (JP); Jiro Yoneda, Kawasaki (JP); Megumi Nagata, Kawasaki (JP); Hiroyuki Orihara, Kawasaki (JP); Hikoyuki Kawata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 860 days.

(21) Appl. No.: 09/907,756

(22) Filed: Jul. 19, 2001

(65) Prior Publication Data

US 2002/0156607 A1    Oct. 24, 2002

(30) Foreign Application Priority Data

Feb. 19, 2001    (JP)    ............................. 2001-042603

(51) Int. Cl.
G06F 17/50    (2006.01)
H01L 21/32    (2006.01)

(52) U.S. Cl. .............................. 703/14; 703/3; 716/18; 382/149

(58) Field of Classification Search ................... 703/1, 703/2, 22, 14, 6; 702/84; 700/103, 121; 706/919; 382/149; 716/18
See application file for complete search history.

(56) References Cited

U.S. PATENT DOCUMENTS

| | | | | | |
|---|---|---|---|---|---|
| 5,208,765 | A | * | 5/1993 | Turnbull | 702/84 |
| 5,544,066 | A | * | 8/1996 | Rostoker et al. | 716/18 |
| 5,694,325 | A | * | 12/1997 | Fukuda et al. | 700/121 |
| 5,754,826 | A | * | 5/1998 | Gamal et al. | 703/14 |
| 6,125,359 | A | * | 9/2000 | Lautzenheiser et al. | 706/60 |
| 6,205,239 | B1 | * | 3/2001 | Lin et al. | 382/149 |
| 6,292,582 | B1 | * | 9/2001 | Lin et al. | 382/149 |
| 6,363,294 | B1 | * | 3/2002 | Coronel et al. | 700/121 |
| 6,483,938 | B1 | * | 11/2002 | Hennessey et al. | 382/149 |
| 6,574,788 | B1 | * | 6/2003 | Levine et al. | 716/18 |
| 6,898,561 | B1 | * | 5/2005 | Liu et al. | 703/14 |

FOREIGN PATENT DOCUMENTS

| | | |
|---|---|---|
| JP | HEI 7-36957 A | 2/1995 |
| JP | 2000-305977 A | 11/2000 |

* cited by examiner

Primary Examiner—Thai Phan
(74) Attorney, Agent, or Firm—Staas & Halsey LLP

(57) ABSTRACT

The apparatus comprises the syntax checking section that checks the syntax of a device model according to a check table showing the relation between the syntax of the device model showing electrical characteristics of a semiconductor device and an amendment when deviating from the syntax. The syntax error amendment creating section corrects the device model according to a corresponding amendment when a description deviating from the syntax is checked by the syntax checking section.

11 Claims, 30 Drawing Sheets

```
|*****************************************************************
|
|
[Model]    XYZ_I_O_33
Model_type  I/O
Polarity    Non-Inverting
Enable           -Low
Vinl = 0.8V
Vinh = 2.0V
Vmeas = 1.5V
Cref = 50pF
Rref = 500
Vref = 0
Vmeas = 1.2V
|
| variable                    typ              min              max

[Temperature Range]           40               100              -40
[Voltage range]               3.3              3                3.6

[Pullup]
|
                              I(typ)           I(min)           I(max)
     -3.30000V                0.116509         0.0849505        0.145087
     -3.20000V                0.115327         0.0841764        0.143416
     -3.10000V                0.114097         0.0833657        0.141689
|( INTERMIDIATE PORTION OMITTED)
      6.50000V                -0.114218        -0.0674947       -0.174972
      6.60000V                -0.11482         -0.06785         -0.175901
|
[Pulldown]

-3.30000V                -0.134306        -0.111183        -0.150432
     -3.20000V                -0.132008        -0.109482        -0.147667
     -3.10000V                -0.129672        -0.107741        -0.144867
|( INTERMIDIATE PORTION OMITTED)
      6.50000V                0.201506         0.121221         0.307612
      6.60000V                0.201725         0.121364         0.30793
|
[GND Clamp]

-3.30000V                -639.0417e-3     -614.3734e-3     -663.6202e-3
     -3.20000V                -612.8006e-3     -589.3179e-3     -636.2674e-3
     -3.10000V                -586.5865e-3     -564.2891e-3     -608.9413e-3
|( INTERMIDIATE PORTION OMITTED)
      3.20000V                -19.3223e-6      28.6349e-6       -96.9135e-6
      3.30000V                159.2199e-12     44.7415e-6       -73.4691e-6
```

```
/****************************************************************         F01a
|
[Model]   XYZ_I_O_33
Model_type  I/O
Polarity    Non-Inverting
Enable      Active-Low
Vinl = 0.8V
Vinh = 2.0V
Vmeas = 1.5V
Cref = 50pF
Rref = 500
Vref = 0
|Vmeas = 1.2V           <---COMMENT OUT
|
| variable              typ        min         max
C_comp                  6.0pF      NA          NA   <--- ADDITION OF
                                                        TYPICAL VALUE
[Temperature Range]     40         100         -40
[Voltage range]   3.3   3.3        3           3.6
|
[Pullup]
              Voltage       I(typ)       I(min)       I(max)
              -3.30000V     0.116509     0.0849505    0.145087
              -3.20000V     0.115327     0.0841764    0.143416
              -3.10000V     0.114097     0.0833657    0.141689
|( INTERMIDIATE PORTION OMITTED )
              6.50000V      -0.114218    -0.0674947   -0.174972
              6.60000V      -0.11482     -0.06785     -0.175901
|
[Pulldown]
              Voltage       I(typ)       I(min)       I(max)
              -3.30000V     -0.134306    -0.111183    -0.150432
              -3.20000V     -0.132008    -0.109482    -0.147667
              -3.10000V     -0.129672    -0.107741    -0.144867
|( INTERMIDIATE PORTION OMITTED )
              6.50000V      0.201506     0.121221     0.307612
              6.60000V      0.201725     0.121364     0.30793
|
[GND Clamp]
              Voltage       I(typ)          I(min)          I(max)
              -3.30000V-    -639.0417e-3    -614.3734e-3    -663.6202e-3
              -3.20000V-    -612.8006e-3    -589.3179e-3    -636.2674e-3
              -3.10000V-    -586.5865e-3    -564.2891e-3    -608.9413e-3
|( INTERMIDIATE PORTION OMITTED )
```

FIG.5

| No. | KEYWORD | SUBPARAMETER | PLANNED PERMISSION FREQUENCY | ERROR NUMBER | CORRESPONDENCE TO UNDEFINED CASE | CORRESPONDENCE TO CASE OF DEFINING FREQUENCY EXCEEDING SPECIFIED FREQUENCY |
|---|---|---|---|---|---|---|
| 1 | [Model] | — | — | — | — | — |
| 2 | | Model_type | 1 (INDISPENSABLE) | SE,CE | NOT CORRECTED | SUBSEQUENTLY DELETED |
| 3 | | Polarity | 0,1 (OMISSIBLE) | — | — | SUBSEQUENTLY DELETED |
| 4 | | Enable | 0,1 (OMISSIBLE) | — | — | SUBSEQUENTLY DELETED |
| 5 | | Vinl | 0,1 (OMISSIBLE) | — | — | SUBSEQUENTLY DELETED |
| 6 | | Vinh | 0,1 (OMISSIBLE) | — | — | SUBSEQUENTLY DELETED |
| 7 | | C_comp | 0,1 (OMISSIBLE) | SE,CE | ADDITION OF TYPICAL VALUE | SUBSEQUENTLY DELETED |
| 8 | | Vmeas | 0,1 (OMISSIBLE) | — | — | SUBSEQUENTLY DELETED |
| 9 | | Cref | 0,1 (OMISSIBLE) | — | — | SUBSEQUENTLY DELETED |
| 10 | | Rref | 0,1 (OMISSIBLE) | — | — | SUBSEQUENTLY DELETED |
| 11 | | Vref | 0,1 (OMISSIBLE) | — | — | SUBSEQUENTLY DELETED |
| 12 | | OTHER THAN THE ABOVE | 0 | — | — | REPLACEMENT WITH MOST-SIMILAR SUBPARAMETER |

FIG.6

| ITEM | INSPECTION SPECIFICATION | ERROR NUMBER | CORRECTION SPECIFICATION |
|---|---|---|---|
| 1 | CHECK WHETHER LENGTH OF Model NAME EXCEEDS 20 CHARACTERS | SE23 | DELETE CHARACTERS EXCESS OF 20 CHARACTERS |
| 2 | *************** | SE34 | ***************** |
| 3 | IS Model_type NAME PERMITTED? | SE36,CE | CORRECT Model-type NAME TO MOST-SIMILAR Model-type NAME |
| 4 | *************** | CE | ***************** |
| 5 | *************** | SE45 | ***************** |
| 6 | IS VALUE OF Enable Active-High OR Active-Low? | SE46 | IS H INCLUDED IN CHARACTER STRING? IN THE CASE OF 11 CHARACTERS OR MORE, CHANGE VALUE OF ENABLE TO Active-High. IN THE CASE OF LESS THAN 11 CHARACTERS, CHANGE VALUE OF ENABLE TO Active-Low |
| 7 | ARE Vinl AND Vinh NUMERICAL VALUES? | SE40,CW | DELETED |
| 8 | ARE VALUES OF Vinl AND Vinh KEPT IN DETERMINATION RANGE? | CW | CHANGE VALUES TO TYPICAL VALUES |
| 9 | IS VALUE OF C_comp typ NUMERICAL VALUE? | SE39,CE14 | CHANGE VALUE TO TYPICAL VALUE |
| 10 | ARE MIN AND MAX VALUES OF C_comp NUMERICAL VALUE OR NA? | SE,CE | CHANGE VALUES TO NA |
| 11 | IS C_comp VALUE KEPT IN RELATION OF min≦typ≦max? | SE,CE | REARRANGE VALUES SO AS TO BE NORMAL ORDER |
| 12 | IS typ VALUE OF C_comp KEPT IN DETERMINATION RANGE? | CW | CORRECT VALUE TO TYPICAL VALUE |
| 13 | ARE min AND max VALUES OF C_comp KEPT IN DETERMINATION RANGE? | CW | CHANGE VALUES TO NA |
| 14 | IS Vmeas NUMERICAL VALUE? | SE41,CE | DELETE |
| 15 | *************** | CW | ***************** |
| 16 | IS Cref NUMERICAL VALUE? | SE42 | DELETE |
| 17 | IS Rref NUMERICAL VALUE? | SE43 | DELETE |
| 18 | IS Vref NUMERICAL VALUE? | SE44 | DELETE |

|(INTERMIDIATE PORTION OMITTED )
|****************************************************************
|
[Model]   XYZ_I_O_25
Model_type  I/O
Polarity   Non-Inverting
Enable    Active-Low
Vinl = 0.7V
Vinh = 1.7V
Vmeas = 1.25V
Cref = 30pF
Rref = 500
Vref = 0
|
| variable | I(typ) | I(min) | I(max) |
|---|---|---|---|
| C_comp | NA | NA | NA |
| [Temperature Range] | 40 | 100 | -40 |
| [Voltage range] | 2.5 | 2.3 | 2.7 |

|
[Pullup]

| Voltage | I(typ) | I(min) | I(max) |
|---|---|---|---|
| -2.50000V | 0.0894584 | 0.0657355 | 0.110196 |
| -2.40000V | 0.0881581 | 0.0648284 | 0.10846 |
| -2.30000V | 0.0867771 | 0.0638563 | 0.106634 |

|( SUBSEQUENT PORTION OMITTED )

|( INTERMIDIATE PORTION OMITTED )
|*************************************************************
|
[Model] XYZ_I_O_25
Model_type I/O
Polarity Non-Inverting
Enable Active-Low
Vinl = 0.7V     <---COMMENT OUT
Vinh = 1.7V
Vmeas = 1.25V
Cref = 30pF
Rref = 500
Vref = 0
|
| variable typ min max
C_comp 5.0 NA NA  <---CHANGE typ
[Temperature Range] 40 100 -40     VALUE TO
[Voltage range] 2.5 2.3 2.7     TYPICAL VALUE
|
[Pullup]

| Voltage | I(typ) | I(min) | I(max) |
|---|---|---|---|
| -2.50000V | 0.0894584 | 0.0657355 | 0.110196 |
| -2.40000V | 0.0881581 | 0.0648284 | 0.10846 |
| -2.30000V | 0.0867771 | 0.0638563 | 0.106634 |

|( SUBSEQUENT PORTION OMITTED )

FIG.9

| ITEM | INSPECTION SPECIFICATION | ERROR NUMBER | CORRECTION SPECIFICATION |
|---|---|---|---|
| 1 | IS VOLTAGE VALUE NUMERICAL VALUE? | SE66,CE48 | DELETE THIS LINE |
| 2 | ARE VOLTAGE VALUES MONOTONOUSLY INCREASED/DECREASED? | CW | SORT VOLTAGE VALUES SO AS TO BE MONOTONOUSLY INCREASED/DECREASED |
| 3 | IS VOLTAGE VALUE DOUBLED? | CW | WHEN VOLTAGE VALUE IS DOUBLED, INTERPOLATE typ, min, AND max VALUES OF CURRENT ACCORDING TO THE FRONT AND REAR DATA VALUES OF EACH VALUE, LEAVE VALUES CLOSEST TO THESE VALUES, AND DELETE OTHER LINES |
| 4 | ※※※※※※※※※※※※※※ | CW49 | ※※※※※※※※※※※※※※ |
| 5 | IS VOLTAGE RANGE EXTENDED UP TO UPPER LIMIT RANGE VALUE OR MORE? | CW73 | ADD DATA EXTENDED UP TO UPPER LIMIT RANGE VALUE ACCORDING TO NEAREST GRADIENT |
| 6 | IS VOLTAGE RANGE EXTENDED UP TO LOWER LIMIT RANGE VALUE OR LESS? | CW73 | ADD DATA EXTENDED UP TO LOWER LIMIT RANGE VALUE ACCORDING TO NEAREST GRADIENT |
| 7 | ARE CURRENT VALUES (typ, min, AND max) NUMERICAL VALUES OR NA? | SE66,CE48 | CHANGE VALUES TO NA |
| 8 | ARE CURRENT VALUES (typ, min, AND max) EQUAL TO OR MORE THAN COMPARATIVE LOWER LIMIT VALUE OR EQUAL TO OR LESS THAN COMPARATIVE UPPER LIMIT VALUE? | CW49 | CHANGE VALUES TO NA |
| 9 | ARE NUMBER OF NUMERICAL DATA VALUE SETS (typ) KEPT BETWEEN 2 AND 100 SETS? NUMBER OF DATA VALUES<2,OR 100< NUMBER OF DATA VALUES: SE | SE,CE,CW | WHEN NUMBER OF DATA VALUE SETS EXCEEDS 100 SETS, CHANGE THE VALUE TO NA, EVERY OTHER ONE FROM BOTH SIDES. WHEN NUMBER OF DATA VALUE SETS IS LESS THAN 2 SETS AND MODEL CAPABLE OF OMITTING THIS KEYWORD IS USED, DELETE MODEL TOGETHER WITH KEYWORD. DO NOT CORRECT OTHERS |
| 10 | ※※※※※※※※※※※※※※ | SE,CE,CW | ※※※※※※※※※※※※※※ |
| 11 | ARE CURRENT VALUES (typ, min, AND max) MONOTONOUSLY INCREASED OR DECREASED? | CW47 | DETERMINE MONOTONOUS INCREASE/DECREASE ACCORDING TO CLAMP CURVE AND SYNTHESIZED V-I CURVE AND CORRECT NOT-MONOTONOUS INCREASE/DECREASE SECTION TO FRONT OR REAR VALUE STILL IN THE CASE OF AN ERROR |
| 12 | ※※※※※※※※※※※※※※ | CW | ※※※※※※※※※※※※※※ |
| 13 | ※※※※※※※※※※※※※※ | CE | ※※※※※※※※※※※※※※ |
| 14 | ※※※※※※※※※※※※※※ | CE | ※※※※※※※※※※※※※※ |

FIG.10

```
|************************************************************           F03
|
[Model]   XYZ_I_O_33
Model_type  I/O
Polarity   Non-Inverting
Enable     Active-Low
Vinl = 0.8V
Vinh = 2.0V
Vmeas = 1.5V
Cref = 50pF
Rref = 500
Vref = 0
|Vmeas = 1.2V
|
```

| variable | typ | min | max |
|---|---|---|---|
| [Temperature Range] | 40 | 100 | -40 |
| [Voltage range]  3.3 | 3.3 | 3 | 3.6 |

[Pullup]

| Voltage | I(typ) | I(min) | I(max) |
|---|---|---|---|
| -3.30000V | 0.116509 | 0.0849505 | 0.145087 |
| -3.20000V | 0.115327 | 0.0841764 | 0.143416 |
| -3.10000V | 0.114097 | 0.0833657 | 0.141689 |

|( INTERMIDIATE PORTION OMITTED )

| 6.50000V | -0.114218 | -0.0674947 | -0.174972 |
|---|---|---|---|
| 6.60000V | -0.11482 | -0.06785 | -0.175901 |

[Pulldown]

| Voltage | I(typ) | I(min) | I(max) |
|---|---|---|---|
| -3.50000V | -0.136306 | -0.113183 | -0.152432 |
| -3.40000V | -0.135306 | -0.112183 | -0.151432 |

|( INTERMIDIATE PORTION OMITTED )

| 6.20000V | 0.200839 | 0.120784 | 0.306639 |
|---|---|---|---|
| 6.30000V | 0.201063 | 0.120931 | 0.306966 |
| 6.40000V | 0.201285 | 0.121076 | 0.30729 |
| 6.50000V | 0.201506 | 0.121221 | 0.307612 |

FIG.11

```
|************************************************************           F03a
|
|[Model]   XYZ_I_O_33
Model_type I/O
Polarity   Non-Inverting
Enable     Active-Low
Vinl = 0.8V
Vinh = 2.0V
Vmeas = 1.5V
Cref = 50pF
Rref = 500
Vref = 0
|Vmeas = 1.2V
|
| variable                       typ           min           max
[Temperature Range]                            40    100    -40
[Voltage range]    3.3           3.3            3            3.6
|
[Pullup]
              Voltage         I(typ)        I(min)        I(max)
            -3.30000V        0.116509      0.0849505     0.145087
            -3.20000V        0.115327      0.0841764     0.143416
            -3.10000V        0.114097      0.0833657     0.141689
|( INTERMIDIATE PORTION OMITTED )
             6.50000V       -0.114218     -0.0674947    -0.174972
             6.60000V       -0.11482      -0.06785      -0.175901
|
[Pulldown]
              Voltage         I(typ)        I(min)        I(max)
|           -3.50000V       -0.136306     -0.113183     -0.152432
            -3.40000V       -0.135306     -0.112183     -0.151432

|( INTERMIDIATE PORTION OMITTED )
             6.20000V        0.200839      0.120784      0.306639
             6.30000V        NA            NA            NA
|            6.40000V        0.201285      0.121076      0.30729
             6.50000V        NA            NA            NA
```

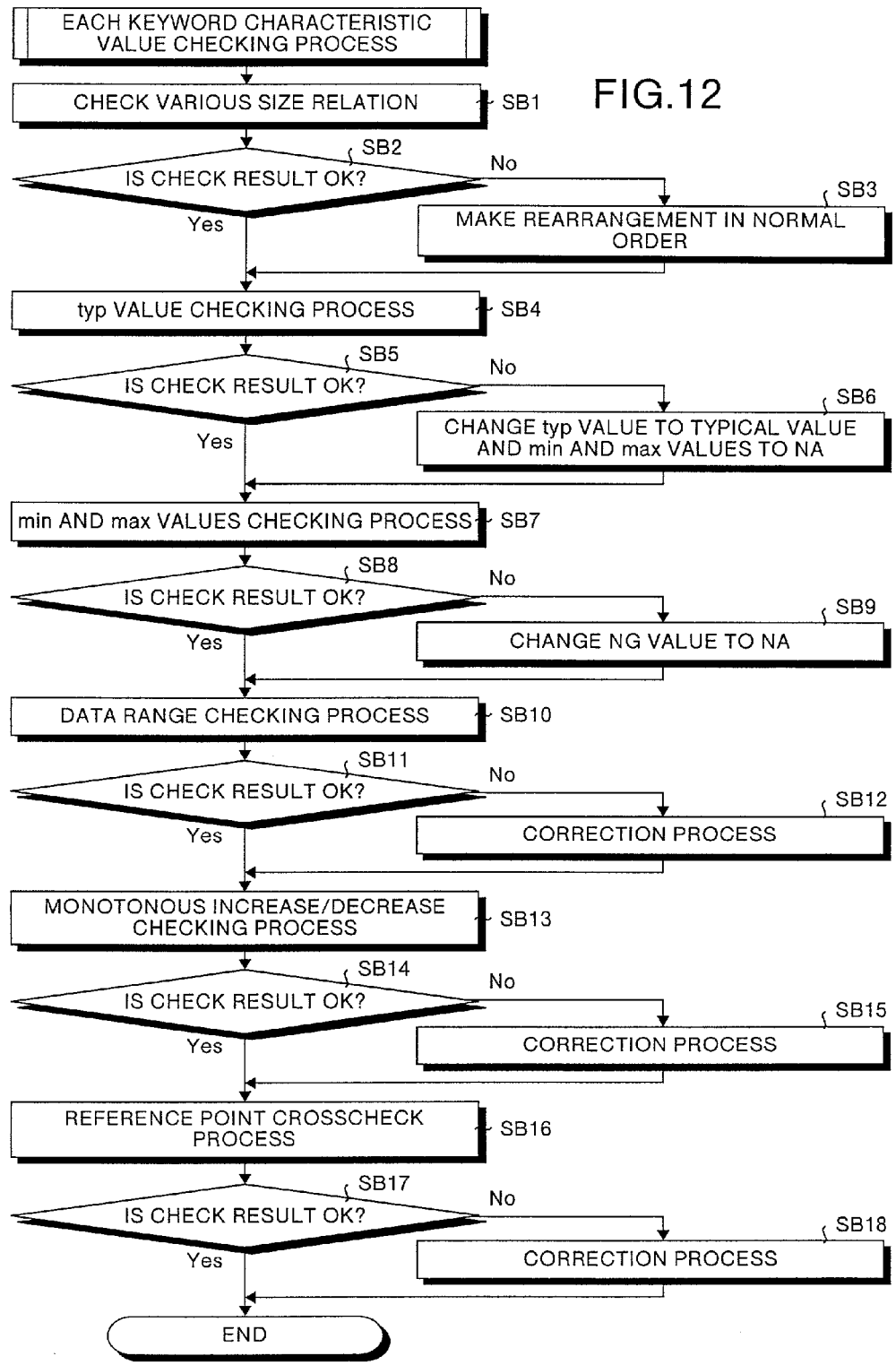

FIG.13

```
|***************************************************************          F04
|
| [Model]   XYZ_I_O_33
  Model_type  I/O
|( INTERMIDIATE PORTION OMITTED )
|Vmeas = 1.2V
|
| variable                        typ              min              max
  C_comp                        4.817pF            5pF              2pF
  [Temperature Range]                              40      100      -40
  [Voltage range]    3.3          3.3               3               3.6
|
[Pullup]
|                 Voltage        I(typ)          I(min)           I(max)
               -3.30000V        0.116509        0.0849505         0.145087
|( INTERMIDIATE PORTION OMITTED )
                6.60000V        -0.11482        -0.06785          -0.175901
|
[Pulldown]
|                 Voltage        I(typ)          I(min)           I(max)
               -3.30000V        -0.134306       -0.111183         -0.150432
|( INTERMIDIATE PORTION OMITTED )
                                 0.201725        0.121364          0.30793
[GND Clamp]
|                 Voltage        I(typ)          I(min)           I(max)
               -3.30000V      -639.0417e-3     -614.3734e-3      -663.6202e-3
|( INTERMIDIATE PORTION OMITTED )
                3.30000V      159.2199e-12      44.7415e-6       -73.4691e-6
[POWER Clamp]
|                 Voltage        I(typ)          I(min)           I(max)
               -3.30000V      130.3497e-3       99.7098e-3       165.8003e-3
|( INTERMIDIATE PORTION OMITTED )
            -100.00000e3V      19.7950e-6       14.0668e-6        25.4220e-6
                4.4409e-16V   154.3064e-12     691.3350e-12       84.9875e-12
|
[ramp]
| variable                        typ                    min                    max
  dV/dt_r         1.4598E+00/2.9537E-10    1.1514E+00/4.3465E-10   1.7306E+00/2.5235E-10
  dV/dt_f         0.0000E+00/2.4240E-10    0.0000E+00/3.7819E-10   0.0000E+00/2.1294E-10
|
```

FIG.14

```
|*************************************************************          F04a
|
|[Model]   XYZ_I_O_33
Model_type  I/O
  (INTERMIDIATE PORTION OMITTED)
Vmeas = 1.2V
|
| variable               typ              min                max
C_comp                4.817pF            5pF                2pF
[Temperature Range]      40              100                -40
[Voltage range]          3.3              3                  3.6
|
[Pullup]
|         Voltage        I(typ)          I(min)             I(max)
        -3.30000V       0.116509        0.0849505          0.145087
   (INTERMIDIATE PORTION OMITTED)
         6.60000V       -0.11482        -0.06785           -0.175901
|
[Pulldown]
|         Voltage        I(typ)          I(min)             I(max)
        -3.30000V       -0.134306       -0.111183          -0.150432
   (INTERMIDIATE PORTION OMITTED)
         6.60000V       0.201725        0.121364           0.30793
|
[GND Clamp]
|         Voltage        I(typ)          I(min)             I(max)
        -3.30000V      -639.0417e-3    -614.3734e-3       -663.6202e-3
   (INTERMIDIATE PORTION OMITTED)
         3.30000V      159.2199e-12    44.7415e-6         -73.4691e-6
|
[POWER Clamp]
|         Voltage        I(typ)          I(min)             I(max)
        -3.30000V      130.3497e-3     99.7098e-3         165.8003e-3
   (INTERMIDIATE PORTION OMITTED)
         4.4409e-16V   154.3064e-12    691.3350e-12       84.9875e-12
|
[ramp]
| variable              typ              min                max
dV/dt_r          1.4598E+00/2.9537E-10  1.1514E+00/4.3465E-10  1.7306E+00/2.5235E-10
dV/dt_f          1.6200E+00/2.4240E-10        NA                    NA
|
```

FIG.16

(INTERMIDIATE PORTION OMITTED)

[GND Clamp]

F05

| Voltage | I(typ) | I(min) | I(max) |
|---|---|---|---|
| -600.00000e-3V | -3.3226e-3 | -1.7969e-3 | -5.0382e-3 |
| -500.00000e-3V | -470.1094e-6 | -328.8948e-6 | -1.0409e-3 |
| -400.00000e-3V | -109.6589e-6 | -99.5657e-6 | -141.6626e-6 |
| -300.00000e-3V | -79.1145e-6 | -57.0263e-6 | -102.5469e-6 |
| -200.00000e-3V | -51.8895e-6 | -36.3789e-6 | -67.6680e-6 |
| 100.00000e-3V | -25.5584e-6 | -17.7270e-6 | -33.5228e-6 |
| 4.4409e-16V | -16.0617e-12 | -496.0634e-12 | -15.1710e-12 |
| 100.00000e-3V | 24.7987e-6 | 16.9219e-6 | 32.8669e-6 |
| 200.00000e-3V | 48.8358e-6 | 33.0992e-6 | 65.0324e-6 |
| 300.00000e-3V | 72.0872e-6 | 48.5104e-6 | 96.4746e-6 |
| 400.00000e-3V | 94.5218e-6 | 63.1285e-6 | 127.1637e-6 |
| 500.00000e-3V | 116.1047e-6 | 76.9239e-6 | 157.0634e-6 |
| 600.00000e-3V | 136.7299e-6 | 89.8626e-6 | 185.6410e-6 |
| 700.00000e-3V | 155.2427e-6 | 101.6916e-6 | 211.8447e-6 |
| 800.00000e-3V | 170.7329e-6 | 110.8693e-6 | 235.1024e-6 |
| 900.00000e-3V | 182.3761e-6 | 116.3279e-6 | 254.6922e-6 |
| 1.00000V | 188.8963e-6 | 116.4977e-6 | 269.5923e-6 |
| 1.10000V | 187.9735e-6 | 107.6219e-6 | 278.2022e-6 |
| 1.20000V | 174.1930e-6 | 69.2256e-6 | 277.6756e-6 |
| 1.30000V | 122.8764e-6 | -113.2633e-6 | 261.7978e-6 |
| 1.40000V | -192.8428e-6 | -126.9096e-6 | 199.8263e-6 |
| 1.50000V | -213.2128e-6 | -130.6883e-6 | -292.4250e-6 |
| 1.60000V | -218.7475e-6 | -130.4739e-6 | -322.8876e-6 |
| 1.70000V | -218.4909e-6 | -127.7724e-6 | -329.6126e-6 |
| 1.80000V | -214.7282e-6 | -123.2444e-6 | -328.5425e-6 |
| 1.90000V | -208.4551e-6 | -117.2552e-6 | -323.0023e-6 |
| 2.00000V | -200.2151e-6 | -110.0382e-6 | -314.3697e-6 |
| 2.10000V | -190.3482e-6 | -101.7882e-6 | -303.3747e-6 |
| 2.20000V | -179.0881e-6 | -92.8352e-6 | -290.4623e-6 |
| 2.30000V | -166.6086e-6 | -83.2611e-6 | -275.9302e-6 |
| 2.40000V | -153.0468e-6 | -73.0820e-6 | -259.9923e-6 |
| 2.50000V | -138.5288e-6 | -62.3114e-6 | -242.8108e-6 |
| 2.60000V | -123.3003e-6 | -50.9624e-6 | -224.5150e-6 |
| 2.70000V | -107.4457e-6 | -39.0475e-6 | -205.2122e-6 |
| 2.80000V | -90.9821e-6 | -26.5784e-6 | -184.9950e-6 |
| 2.90000V | -73.9243e-6 | -13.5647e-6 | -163.9462e-6 |
| 3.00000V | -56.2866e-6 | 691.3350e-12 | -142.1720e-6 |
| 3.10000V | -38.0822e-6 | 14.0668e-6 | -119.8190e-6 |
| 3.20000V | -19.3223e-6 | 28.6349e-6 | -96.9135e-6 |
| 3.30000V | 159.2199e-12 | 44.7415e-6 | -73.4691e-6 |

FIG.17

F05a (INTERMIDIATE PORTION OMITTED)
[GND Clamp]

| Voltage | I(typ) | I(min) | I(max) |
|---|---|---|---|
| -3.300E+00 | -8.034E-02 | -4.143E-02 | -1.130E-01 |
| -600.00000e-3V | -3.3226e-3 | -1.7969e-3 | -5.0382e-3 |
| -500.00000e-3V | -470.1094e-6 | -328.8948e-6 | -1.0409e-3 |
| -400.00000e-3V | -109.6589e-6 | -99.5657e-6 | -141.6626e-6 |
| -300.00000e-3V | -79.1145e-6 | -57.0263e-6 | -102.5469e-6 |
| -200.00000e-3V | -51.8895e-6 | -36.3789e-6 | -67.6680e-6 |
| -100.00000e-3V | -25.5584e-6 | -17.7270e-6 | -33.5228e-6 |
| 4.4409e-16V | -16.0617e-12 | -496.0634e-12 | -15.1710e-12 |
| 100.00000e-3V | 24.7987e-6 | 16.9219e-6 | 32.8669e-6 |
| 200.00000e-3V | 48.8358e-6 | 33.0992e-6 | 65.0324e-6 |
| 300.00000e-3V | 72.0872e-6 | 48.5104e-6 | 96.4746e-6 |
| 400.00000e-3V | 94.5218e-6 | 63.1285e-6 | 127.1637e-6 |
| 500.00000e-3V | 116.1047e-6 | 76.9239e-6 | 157.0634e-6 |
| 600.00000e-3V | 136.7299e-6 | 89.8626e-6 | 185.6410e-6 |
| 700.00000e-3V | 155.2427e-6 | 101.69 16e-6 | 211.8447e-6 |
| 800.00000e-3V | 170.7329e-6 | 110.8693e-6 | 235.1024e-6 |
| 900.00000e-3V | 182.3761e-6 | 116.3279e-6 | 254.6922e-6 |
| 1.00000V | 188.8963e-6 | 116.4977e-6 | 269.5923e-6 |
| 1.10000V | 187.9735e-6 | 107.6219e-6 | 278.2022e-6 |
| 1.20000V | 174.1930e-6 | 69.2256e-6 | 277.6756e-6 |
| 1.30000V | 122.8764e-6 | -113.2633e-6 | 261.7978e-6 |
| 1.40000V | -192.8428e-6 | -126.9096e-6 | 199.8263e-6 |
| 1.50000V | -213.2128e-6 | -130.6883e-6 | -292.4250e-6 |
| 1.60000V | -218.7475e-6 | -130.4739e-6 | -322.8876e-6 |
| 1.70000V | -218.4909e-6 | -127.7724e-6 | -329.6126e-6 |
| 1.80000V | -214.7282e-6 | -123.2444e-6 | -328.5425e-6 |
| 1.90000V | -208.4551e-6 | -117.2552e-6 | -323.0023e-6 |
| 2.00000V | -200.2151e-6 | -110.0382e-6 | -314.3697e-6 |
| 2.10000V | -190.3482e-6 | -101.7882e-6 | -303.3747e-6 |
| 2.20000V | -179.0881e-6 | -92.8352e-6 | -290.4623e-6 |
| 2.30000V | -166.6086e-6 | -83.2611e-6 | -275.9302e-6 |
| 2.40000V | -153.0468e-6 | -73.0820e-6 | -259.9923e-6 |
| 2.50000V | -138.5288e-6 | -62.3114e-6 | -242.8108e-6 |
| 2.60000V | -123.3003e-6 | -50.9624e-6 | -224.5150e-6 |
| 2.70000V | -107.4457e-6 | -39.0475e-6 | -205.2122e-6 |
| 2.80000V | -90.9821e-6 | -26.5784e-6 | -184.9950e-6 |
| 2.90000V | -73.9243e-6 | -13.5647e-6 | -163.9462e-6 |
| 3.00000V | -56.2866e-6 | 691.3350e-12 | -142.1720e-6 |
| 3.10000V | -38.0822e-6 | 14.0668e-6 | -119.8190e-6 |
| 3.20000V | -19.3223e-6 | 28.6349e-6 | -96.9135e-6 |
| 3.30000V | 159.2199e-12 | 44.7415e-6 | -73.4691e-6 |

FIG.19

| ITEM | INSPECTION SPECIFICATION | ERROR NUMBER | CORRECTION SPECIFICATION |
|---|---|---|---|
| 1 | IS VOLTAGE VALUE NUMERICAL VALUE? | SE76,CE58 | DELETE THIS LINE |
| 2 | ARE VOLTAGE VALUES MONOTONOUSLY INCREASED OR DECREASED? (NOTE 1) | CW | SORT VOLTAGE VALUES SO AS TO BE MONOTONOUSLY INCREASED OR DECREASED |
| 3 | IS VOLTAGE VALUE DOUBLED? (NOTE 2) | CW | WHEN VOLTAGE VALUE IS DOUBLED, INTERPOLATE typ, min, AND max VALUES OF CURRENT ACCORDING TO FRONT AND REAR DATA VALUES OF EACH VALUE, LEAVE VALUES CLOSEST TO THESE VALUES, AND DELETE OTHER LINES |
| 4 | IS VOLTAGE KEPT BETWEEN COMPARATIVE LOWER LIMIT VALUE AND COMPARATIVE UPPER LIMIT VALUE? | CW59 | DELETE THIS LINE |
| 5 | IS VOLTAGE RANGE EXTENDED UP TO UPPER LIMIT RANGE VALUE OR MORE? | CW72 | ADD DATA EXTENDED UP TO UPPER LIMIT RANGE VALUE ACCORDING TO NEAREST GRADIENT |
| 6 | IS VOLTAGE RANGE EXTENDED TO LOWER LIMIT RANGE VALUE OR LESS? | CW72 | ADD DATA EXTENDED UP TO LOWER LIMIT RANGE VALUE ACCORDING TO NEAREST GRADIENT |
| 7 | ARE CURRENT VALUES (typ, min, AND max) NUMERICAL VALUES OR NA? | SE76,CE58 | CHANGE VALUES TO NA |
| 8 | ARE CURRENT VALUES (typ, min, AND max) KEPT BETWEEN COMPARATIVE LOWER LIMIT VALUE AND COMPARATIVE UPPER LIMIT VALUE? | CW59 | CHANGE VALUES TO NA |
| 9 | IS NUMBER OF NUMERICAL DATA VALUE SETS (typ) OTHER THAN NA KEPT BETWEEN 2 AND 100 SETS? | SE,CE,CW | NUMBER OF DATA VALUE SETS < 2 OR 100 < NUMBER OF DATA VALUE SETS: SE IN THE CASE OF MORE THAN 100 SETS, THIN DATA VALUE SETS FROM BOTH SIDES EVERY OTHER ONE (CHANGE VALUES TO NA). IN THE CASE OF MODEL TYPE HAVING LESS THAN TWO SETS OF DATA VALUES AND CAPABLE OF OMITTING THE KEYWORD, DELETE MODEL TYPE TOGETHER WITH KEYWORD. DO NOT EXECUTE CORRECTION IN THE CASE OF 100 SETS OR LESS AND TWO SETS OR MORE |
| 10 | ARE NUMBER OF NUMERICAL DATA VALUE SETS (min, max) KEPT BETWEEN 2 AND 100 SETS? • SAME DETERMINATION WITH typ HOWEVER, IT IS OK WHEN ALL NUMBERS OF NUMERICAL DATA VALUE IS NA | SE,CE,CW | WHEN NUMBER OF DATA VALUE SETS EXCEEDS 100 SETS (CHANGE THE VALUE TO NA), EVERY OTHER ONE FROM BOTH SIDES. WHEN NUMBER OF DATA VALUE SETS IS LESS THAN 2 SETS AND MODEL CAPABLE OF OMITTING THIS KEYWORD IS USED, DELETE MODEL TOGETHER WITH KEYWORD. DO NOT CORRECT OTHERS |
| 11 | CHECK WHETHER CURRENT VALUES (typ, min, AND max) ARE MONOTONOUSLY INCREASED OR DECREASED? (NOTE 3) | CW57 | CORRECT NOT-MONOTONOUS INCREASE/DECREASE PART TO FRONT OR REAR VALUE. (NOTE 5) |
| 12 | CHECK WHETHER THE WHOLE IS VOLTAGE RISE AND CURRENT INCREASE OR VOLTAGE DROP AND CURRENT DECREASE (COMPARE THEM WITH INITIAL AND FINAL DATA VALUES) | CE | DO NOT EXECUTE CORRECTION |
| 13 | CHECK IF CURRENT VALUES (typ, min, AND max) CROSS REFERENCE POINT | CE116 | MOVE EVERY DATA UP TO REFERENCE POINT (typ, min, AND max INDEPENDENTLY) |

(INTERMIDIATE PORTION OMITTED)

| [GND_clamp] | | | |
|---|---|---|---|
| Voltage | I(typ) | I(min) | I(max) |
| 3.30 | 0.0mA | NA | NA |
| 0.000 | 5.242E-07 | NA | NA |
| -0.031 | 1.048E-06 | NA | NA |
| -0.062 | 0.000E+00 | NA | NA |
| -0.092 | 2.621E-07 | NA | NA |
| -0.123 | -2.621E-07 | NA | NA |
| -0.153 | 2.621E-07 | NA | NA |
| -0.184 | -2.621E-07 | NA | NA |
| -0.215 | 7.862E-07 | NA | NA |
| -0.245 | 0.000E+00 | NA | NA |

(INTERMIDIATE PORTION OMITTED)

| | | | |
|---|---|---|---|
| -1.470 | -4.845E-02 | NA | NA |
| -1.500 | -5.025E-02 | NA | NA |
| -3.30V | -150.10mA | NA | NA |

FIG.21

F06a (INTERMIDIATE PORTION OMITTED)

| [GND_clamp] | | | |
|---|---|---|---|
| Voltage | I(typ) | I(min) | I(max) |
| 3.30 | 5.242E-07 | NA | NA |
| 0.000 | 5.242E-07 | NA | NA |
| -0.031 | 5.242E-07 | NA | NA |
| -0.062 | 2.621E-07 | NA | NA |
| -0.092 | 2.621E-07 | NA | NA |
| -0.123 | -2.621E-07 | NA | NA |
| -0.153 | -2.621E-07 | NA | NA |
| -0.184 | -2.621E-07 | NA | NA |
| -0.215 | -2.621E-07 | NA | NA |
| -0.245 | -2.621E-07 | NA | NA |

(INTERMIDIATE PORTION OMITTED)

| | | | |
|---|---|---|---|
| -1.470 | -4.845E-02 | NA | NA |
| -1.500 | -5.025E-02 | NA | NA |
| -3.30V | -150.10mA | NA | NA |

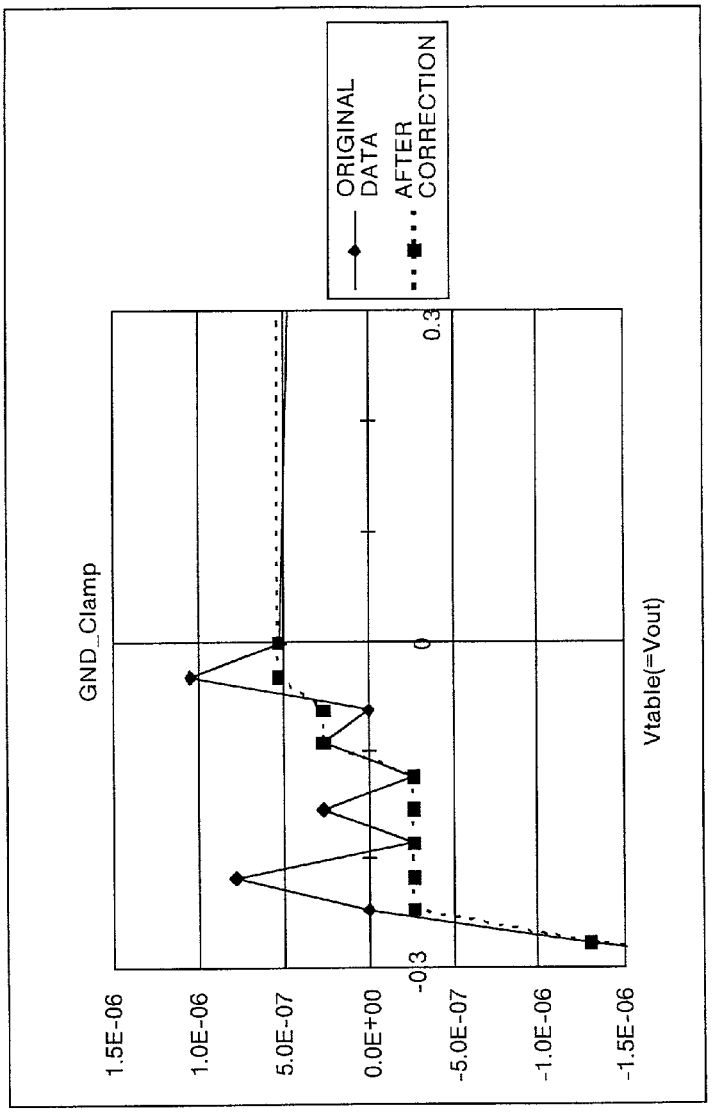

FIG.23

F07 

(INTERMIDIATE PORTION OMITTED)

[GND Clamp]

| Voltage | I(typ) | I(min) | I(max) |
|---|---|---|---|
| −2.50000V | −80.4620e−3 | −60.7270e−3 | −105.3878e−3 |
| −2.40000V | −74.5314e−3 | −56.1148e−3 | −98.1536e−3 |
| −2.30000V | −68.6909e−3 | −51.5797e−3 | −91.0121e−3 |
| −2.20000V | −62.9490e−3 | −47.1298e−3 | −83.9720e−3 |
| −2.10000V | −57.3158e−3 | −42.7736e−3 | −77.0430e−3 |
| −2.00000V | −51.8024e−3 | −38.5212e−3 | −70.2360e−3 |
| −1.90000V | −46.4214e−3 | −34.3840e−3 | −63.5633e−3 |
| −1.80000V | −41.1871e−3 | −30.3749e−3 | −57.0388e−3 |
| −1.70000V | −36.1162e−3 | −26.5090e−3 | −50.6781e−3 |
| −1.60000V | −31.2275e−3 | −22.8035e−3 | −44.4991e−3 |
| −1.50000V | −26.5430e−3 | −19.2786e−3 | −38.5225e−3 |
| −1.40000V | −22.0883e−3 | −15.9583e−3 | −32.7719e−3 |
| −1.30000V | −17.8937e−3 | −12.8705e−3 | −27.2749e−3 |
| −1.20000V | −13.9952e−3 | −10.0493e−3 | −22.0640e−3 |
| −1.10000V | −10.4364e−3 | −7.5359e−3 | −17.1781e−3 |
| −1.00000V | −7.2716e−3 | −5.3814e−3 | −12.6649e−3 |
| −900.00000e−3V | −4.5704e−3 | −3.6513e−3 | −8.5865e−3 |
| −800.00000e−3V | −2.4287e−3 | −2.4325e−3 | −5.0334e−3 |
| −700.00000e−3V | −998.3414e−6 | −1.6133e−3 | −2.1535e−3 |
| −600.00000e−3V | −341.8812e−6 | −876.7254e−6 | −391.2937e−6 |
| −500.00000e−3V | −100.9906e−6 | −304.6710e−6 | −112.9872e−6 |
| −400.00000e−3V | −66.7708e−6 | −70.7737e−6 | −86.7540e−6 |
| −300.00000e−3V | −48.7412e−6 | −35.1329e−6 | −64.1783e−6 |
| −200.00000e−3V | −31.8371e−6 | −21.9445e−6 | −42.2434e−6 |
| −100.00000e−3V | −15.5969e−6 | −10.5983e−6 | −20.8557e−6 |
| 0.V | −15.5969e−6 | −10.5983e−6 | −20.8557e−6 |

[POWER Clamp]

| Voltage | I(typ) | I(min) | I(max) |
|---|---|---|---|
| −2.50000V | 80.4620e−3 | 60.7270e−3 | 105.3878e−3 |
| −2.40000V | 74.5314e−3 | 56.1148e−3 | 98.1536e−3 |

(INTERMIDIATE PORTION OMITTED)

FIG.24

(INTERMIDIATE PORTION OMITTED)

F07a

[GND Clamp]

| Voltage | I(typ) | I(min) | I(max) |
|---|---|---|---|
| −2.50000V | −8.045E-02 | −6.072E-02 | −1.054E-01 |
| −2.40000V | −7.452E-02 | −5.610E-02 | −9.813E-02 |
| −2.30000V | −6.868E-02 | −5.157E-02 | −9.099E-02 |
| −2.20000V | −6.293E-02 | −4.712E02 | −8.395E-02 |
| −2.10000V | −5.730E-02 | −4.276E-02 | −7.702E-02 |
| −2.00000V | −5.179E-02 | −3.851E-02 | −7.022E-02 |
| −1.90000V | −4.641E-02 | −3.437E-02 | −6.354E-02 |
| −1.80000V | −4.117E-02 | −3.036E-02 | −5.702E-02 |
| −1.70000V | −3.610E-02 | −2.650E-02 | −5.066E-02 |
| −1.60000V | −3.121E-02 | −2.279E02 | −4.448E-02 |
| −1.50000V | −2.653E-02 | −1.927E-02 | −3.850E-02 |
| −1.40000V | −2.207E-02 | −1.595E-02 | −3.275E-02 |
| −1.30000V | −1.788E-02 | −1.286E-02 | −2.725E-02 |
| −1.20000V | −1.398E-02 | −1.004E-02 | −2.204E-02 |
| −1.10000V | −1.042E-02 | −7.525E-03 | −1.716E-02 |
| −1.00000V | −7.256E-03 | −5.371E-03 | −1.264E-02 |
| −900.00000e-3V | −4.555E-03 | −3.641E-03 | −8.566E-03 |
| −800.00000e-3V | −2.413E-03 | −2.422E-03 | −5.013E-03 |
| −700.00000e-3V | −9.827E-04 | −1.603E-03 | −2.133E-03 |
| −600.00000e-3V | −3.263E-04 | −8.661E-04 | −3.704E-04 |
| −500.00000e-3V | −8.539E-05 | −2.941E-04 | −9.213E-05 |
| −400.00000e-3V | −5.117E-05 | −6.018E-05 | −6.590E-05 |
| −300.00000e-3V | −3.314E-05 | −2.453E-05 | −4.332E-05 |
| −200.00000e-3V | −1.624E-05 | −1.135E-05 | −2.139E-05 |
| −100.00000e-3V | 0.000E+00 | 0.000E+00 | 0.000E+00 |
| 0.V | 0.000E+00 | 0.000E+00 | 0.000E+00 |

[POWER Clamp]

| Voltage | I(typ) | I(min) | I(max) |
|---|---|---|---|
| −2.50000V | 80.4620e-3 | 60.7270e-3 | 105.3878e-3 |
| −2.40000V | 74.5314e-3 | 56.1148e-3 | 98.1536e-3 |

(INTERMIDIATE PORTION OMITTED)

HEADER DATA
| | | |
|---|---|---|
| (1) | [IBIS Ver] | 2.1 |
| (2) | [Comment Char] | l_char |
| (3) | [File Name] | ABC.ibs |
| (4) | [File Rev] | 1.0 |
| (5) | [Data] | 9/9/2000 |
| (6) | [Souce] | File originated at ABC Lmited |
| (7) | [Notes] | The following information is an IBIS list for the |
| (8) | [Disclaimer] | This infomation is for modeling purposes only |
| (9) | [Copyright] | Copyright 1999,ABC Corp,All Rights Reserved |

COMPONENT DATA

(10) [component]AAA
(11) [Manufacturer]ABC Limited
(12) [Package]

| | typ | min | max |
|---|---|---|---|
| R_pkg | 3.40E-01 | 2.55E-01 | 4.29E-01 |
| L_pkg | 15.3E-09 | 10.1E-09 | 21.6E-09 |
| C_pkg | 4.77E-13 | 4.10E-13 | 6.03E-13 |

(13)
| [pin] | Signal_name | Model_name | R_pin | L_pin | C_pin |
|---|---|---|---|---|---|
| 1 | VCC | POWER | 0.036 | 5.846nH | 0.624pF |
| 2 | DQ0 | D16_I0 | 0.035 | 5.826nH | 0.614pF |
| 3 | DQ1 | D16_I0 | 0.034 | 5.806nH | 0.604pF |
| 4 | VSSQ | GND | 0.033 | 5.806nH | 0.604pF |
| 5 | NG | NG | 0.032 | 5.826nH | 0.594pF |
| ... | ...... | ...... | ...... | ...... | ...... |

PIN MODEL DATA

(14) [Model] D16_I0
(14-1) Model_Type I/O
(14-2) Polarity Non-Inverting
(14-3) Enable Active-Low
(14-4) Vinl =0.4V
      Vinh =2.4V
(14-5) Vmeas =1.4V
(14-6) Cref =30pF
      Rref =50
      Vref =1.4V

| | typ | min | max |
|---|---|---|---|
| (14-7) C_comp | 4.0E-12 | 3.6E-12 | 4.5E-12 |

| | | typ | min | max |
|---|---|---|---|---|
| (15) | [Temperature Range] | 25 | -10 | 100 |
| (16) | [Voltage Range] | 3.30 | 3.00 | 3.60 |

METHOD OF AND APPARATUS FOR AUTOMATICALLY CORRECTING DEVICE MODEL, AND COMPUTER PRODUCT

FIELD OF THE INVENTION

The present invention relates to a technology for checking and automatically correcting a device model used for a transmission simulation on a printed circuit board.

BACKGROUND OF THE INVENTION

Recently, each of many electronic makers receives a semiconductor device and a device model obtained by modeling the semiconductor device from a semiconductor vendor and performs circuit design and transmission simulation of a printed circuit board to be mounted on an electronic device. Moreover, though a spice model and an IBIS (Input/output Buffer Information Specification) model are publicly known as device models, the latter IBIS model is mainstream.

Therefore, most electronic makers respectively perform circuit design and transmission simulation of a printed circuit board using a semiconductor device according to an IBIS model received from a semiconductor vendor. However, when checking by a semiconductor vendor is not strict, an IBIS model in which many errors are included in description syntax or various parameters is supplied to an electronic maker. Therefore, a problem occurs that a trouble occurs in a printed circuit board concerned serving as an actual model even if there is no problem in circuit design and transmission simulation. Therefore, unit and a method for effectively solving the above problem have been earnestly desired so far.

The spice model serving as a device model is used to show circuit operations to a designer by simulating the circuit operations by a computer without forming an actual circuit on a printed circuit board and show a process parameter or configuration of a circuit. Therefore, when supplying the spice model to an electronic maker, the process parameter and configuration of a circuit included in the company secret of a semiconductor vendor is opened to the public and thereby, a state undesirable for the semiconductor vendor occurs.

However, the IBIS model shows input/output characteristics of a semiconductor device, in which the package characteristic, V/I (voltage/current) characteristic, and switching characteristic of the semiconductor device are described in the form of a table.

Therefore, when supplying the IBIS model to an electronic maker, advantages are obtained that the process parameter and configuration of a circuit included in the company secret of a semiconductor vendor are not opened to the public and moreover, the information necessary for circuit design and transmission simulation is obtained by an electronic maker side. Therefore, the IBIS model is conventionally mainstream as a device model to be supplied to an electronic maker from a semiconductor vendor.

FIG. 29 and FIG. 30 are illustrations showing an IBIS file F0 showing the IBIS model. As shown in FIG. 29 and FIG. 30, the IBIS file F0 is constituted of header data and part data. Moreover, the part data includes pin model data.

The header data includes the data for the file name, date, and version and the like about the IBIS file F0. Specifically, in the case of the header data shown in FIG. 29, the version of an IBIS is described in [IBIS Ver] and comment characters are described in [Comment Char]. The file name of the IBIS file F0 is described in [File Name] and the revision level of the IBIS file F0 is described in [File Rev]. The creation date of the IBIS file F0 is described in [Date].

The creation source of the IBIS file F0 is described in [Source] and notes about the IBIS file F0 are described in [Notes]. The information about disclaimer of right is described in [Disclaimer] and the information about copyright is described in [Copyright].

Moreover, in the case of the part data shown in FIG. 29, the formal type name of the semiconductor device concerned is described in [Component] and the information about the manufacturer of the semiconductor device concerned is described in [Manufacturer]. Values such as the RLC (resistance value, inductance, and capacitance) of the default of the package section of a semiconductor device are described in [Package] and the information about relating of an I/O model with an external pin and a signal name is described in [Pin].

Moreover, in the case of the pin model data, the definition of a pin model is described in [Model]. The definition starts with [Model] and is described up to the next [Model] (not shown) or [End] (refer to FIG. 30). The information about the model type of a pin is described in [Model_type] and the information about electrical polarities (Non-Inverting or Inverting) is described in [Polarity].

The information for designating active high or active low (Active-High or Active-Low) is described in [Enable]. The upper limit of an input low-level voltage is described in [Vinl] and the lower limit of an input high-level voltage is described in [Vinh]. A measurement reference voltage value for measuring the propagation delay and output switching time of a semiconductor device is described in [Vmeas].

The circuit configuration information (capacitance value, resistance value, and voltage value) for measuring the propagation delay and output switching time of a semiconductor device is described in [Cref], [Rref], and [Vref]. The capacitance value of a silicon die is described in [C_comp]. The operating temperature of a semiconductor device is described in [Temperature Range]. The supply voltage value for measuring [Pullup] and [Power clamp] (refer to FIG. 30) to be described later is described in [Voltage range].

The V/I (voltage/current) characteristic of a pulled-down output buffer is described in [Pulldown] shown in FIG. 30 and the V/I (voltage/current) characteristic of a pulled-up output buffer is described in [Pullup]. The V/I characteristic of a grounded clamp diode is described in [GND_clamp]. The V/I characteristic of a clamp diode connected to a power supply is described in [Power_clamp].

The rise time (dV/dt_r) and fall time (dV/dt_f) of an output pin voltage are described in [Ramp]. dV is equal to 20 to 80% of the amplitude of an output pin voltage dt denotes the time consumed for 20 to 80%. [End] is described in the end of the IBIS file concerned.

A semiconductor vendor converts the spice model to the IBIS model by using a conversion tool and supplies the IBIS file F0 corresponding to the IBIS model to an electronic maker. The electronic maker executes circuit design and transmission simulation by using the IBIS file F0.

As described above, an IBIS model including trouble information may be conventionally supplied to an electronic maker due to erroneous setting of or insufficient checking by a conversion tool when converting a spice model to an IBIS model.

In this case, because an electronic maker executes circuit design and transmission simulation by using an IBIS model including trouble information, a critical problem occurs that a trouble occurs in a printed circuit board serving as an actual model.

In this case, to solve the above problem, it is considered that the electronic maker checks the trouble of the IBIS model and corrects the trouble information. However, an advanced user skill well-versed in an IBIS model is requested for the checking and correction of the trouble information.

Therefore, in the case of an electronic maker insufficient in the number of talents having the user skill, it is substantially difficult to perform checking and correction of trouble information and the maker cannot find a trouble until a trouble occurs in a printed circuit board serving as an actual model and then it cannot be helped to take a post-action that the maker requests a semiconductor vendor to specify and correct a defective section of an IBIS model. Therefore, it is conventionally difficult to completely correspond to the needs of designing a printed circuit board in a short period.

SUMMARY OF THE INVENTION

It is an object of this invention to provide an automatic device model correcting program, an automatic device model correcting apparatus, and an automatic device model correcting method capable of quickly and accurately checking a device model and correcting a defective section without depending on the user skill.

According to the present invention the description rule of a device model is checked according to a description rule table showing the relation between the description rule of a device model showing the electrical characteristic of a semiconductor device and an amendment when deviating from the description rule, and the device model is corrected according to a corresponding amendment when a description deviating from the checked description rule.

Other objects and features of this invention will become apparent from the following description with reference to the accompanying drawings.

BRIEF DESCRIPTION OF THE DRAWINGS

FIG. 4 is an illustration showing an IBIS file F01a of the embodiment shown in FIG. 1;

FIG. 5 is an illustration showing a check table 200 of the embodiment shown in FIG. 1;

FIG. 6 is an illustration showing a check table 210 of the embodiment shown in FIG. 1;

FIG. 7 is an illustration showing an IBIS file F02 of the embodiment shown in FIG. 1;

FIG. 8 is an illustration showing an IBIS file F02a of the embodiment shown in FIG. 1;

FIG. 9 is an illustration showing a check table 220 of the embodiment shown in FIG. 1;

FIG. 10 is an illustration showing an IBIS file F03 of the embodiment shown in FIG. 1;

FIG. 11 is an illustration showing an IBIS file F03a of the embodiment shown in FIG. 1;

FIG. 12 is a flow chart for explaining the each keyword characteristic value checking process shown in FIG. 2;

FIG. 13 is an illustration showing an IBIS file F04 of the embodiment shown in FIG. 1;

FIG. 14 is an illustration showing an IBIS file F04a of the embodiment shown in FIG. 1;

FIG. 16 is an illustration showing an IBIS file F05 of the embodiment shown in FIG. 1;

FIG. 17 is an illustration showing an IBIS file F05a of the embodiment shown in FIG. 1;

FIG. 19 is an illustration showing a check table 230 of the embodiment shown in FIG. 1;

FIG. 20 is an illustration showing an IBIS file F06 of the embodiment shown in FIG. 1;

FIG. 21 is an illustration showing an IBIS file F06a of the embodiment shown in FIG. 1;

FIG. 22 is an illustration for explaining the monotonous increase/decrease checking process shown in FIG. 12;

FIG. 23 is an illustration showing an IBIS file F07 of the embodiment shown in FIG. 1;

FIG. 24 is an illustration showing an IBIS file F07a of the embodiment shown in FIG. 1;

FIG. 26 is an illustration showing a screen 320 of the embodiment shown in FIG. 1;

FIG. 29 is an illustration showing an IBIS file F0; and

DESCRIPTION OF THE PREFERRED EMBODIMENTS

Embodiments of an automatic device model correcting program, an automatic device model correcting apparatus, and an automatic device model correcting method are described below in detail by referring to the accompanying drawings.

Figure 1:
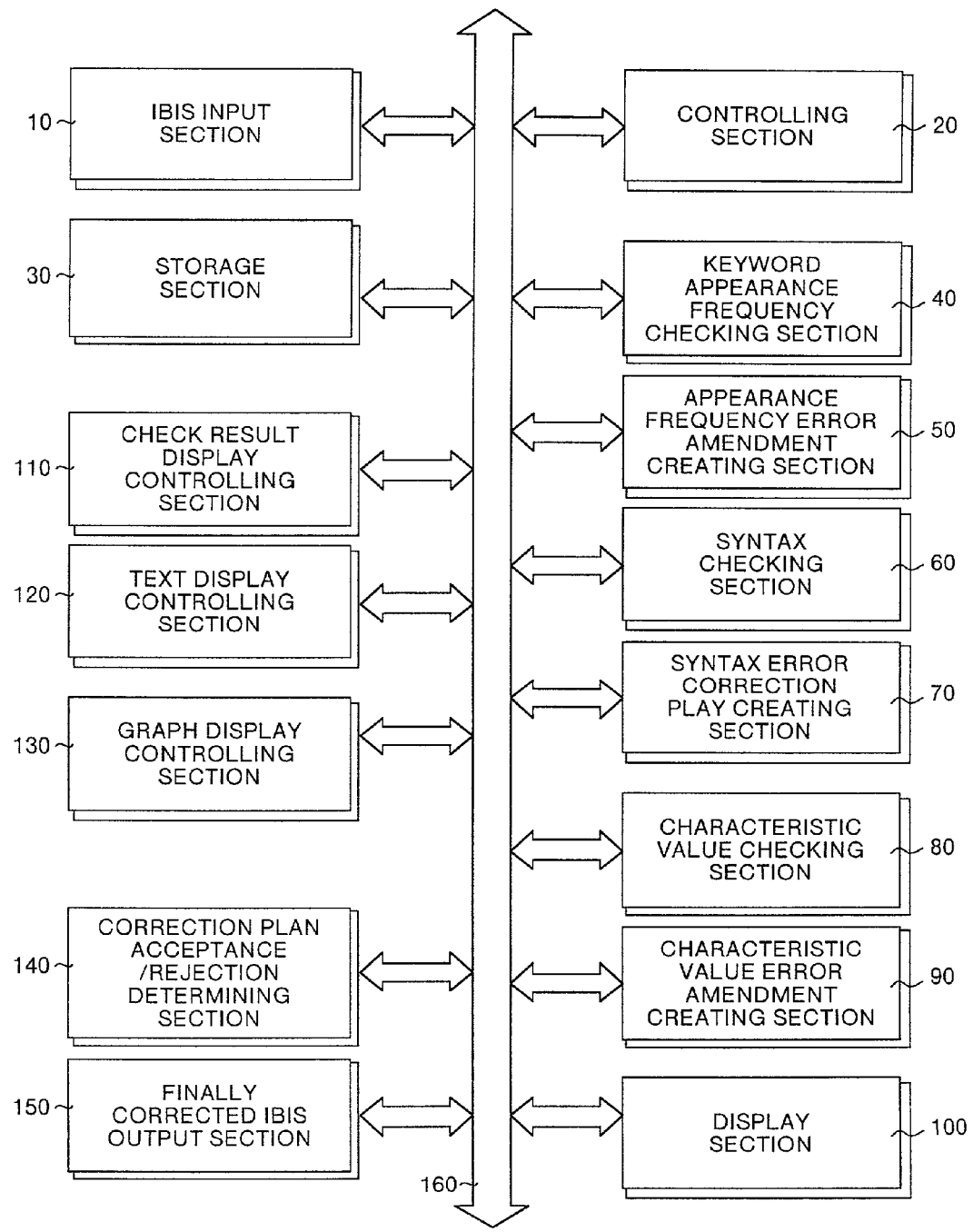
FIG. 1 is a block diagram showing a configuration of an embodiment of the present invention.

FIG. 1 is a block diagram showing a configuration of an embodiment of the present invention. FIG. 1 illustrates a configuration of an automatic device model correcting apparatus for executing an automatic device model correcting program and an automatic device model correcting method. The automatic device model correcting apparatus is provided for an electronic maker side.

Figure 30:
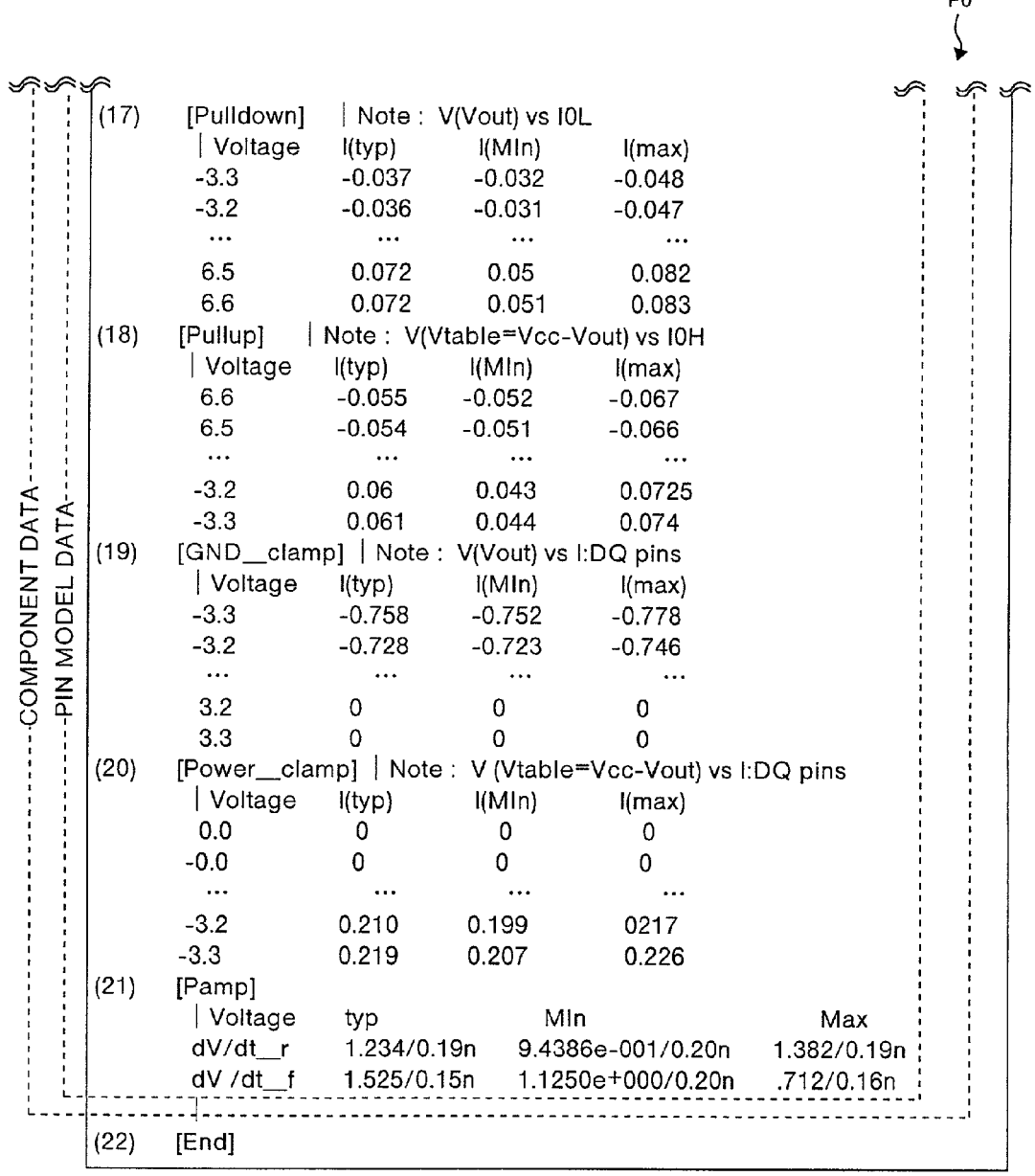
FIG. 30 is an illustration showing another IBIS file F0.

As shown in FIG. 1, an IBIS input section 10 is used to input an IBIS file having a format same as that of the IBIS file F0 (refer to FIG. 29 and FIG. 30). The IBIS file is supplied from a semiconductor vendor to an electronic maker and serves as a file corresponding to the IBIS model. A controlling section 20 controls various sections of an automatic device model correcting apparatus.

A storage section 30 is provided with a large capacity storage medium such as a hard disk or an optical disk and stores the IBIS file and the like to be corrected, a check table 200 (refer to FIG. 5), a check table 210 (refer to FIG. 6), a check table 220 (refer to FIG. 9), a check table 230 (refer to FIG. 19), and a corrected IBIS file.

The check table 200 shown in FIG. 5 is a table used to check the keyword appearance frequency showing whether the keyword appearance frequency for an IBIS file (IBIS model) is equal to a specified frequency and create an amendment when a result of checking the keyword appearance frequency is NG, which is provided with fields of "No.", "keyword", "subparameter", "specified permission frequency", "error number", "correspondence to undefined case", and "correspondence to case of defining frequency exceeding specified frequency".

"Keyword" is a term used to check a keyword appearance frequency for an IBIS file such as [Model] (refer to FIG. 29). A subparameters (Model_type, Polarity, . . . , Vref, and other than the above) for defining [Model] are described in "subparameter".

A specified subparameter permission (definition) frequency for an IBIS file is described in "specified permission frequency". An error number when a subparameter for an IBIS file exceeds a permission frequency is described in "error number". The correspondence when a subparameter to be defined in an IBIS file is not defined is described in "corresponding to undefined case". The correspondence when a subparameter for an IBIS file exceeds a permission frequency is described in "correspondence when a subparameter for an IBIS file exceeds a permission frequency is described in "correspondence to case of defining frequency exceeding specified frequency".

The check table 210 shown in FIG. 6 is a table used to check whether the syntax and characteristic value for an IBIS file (IBIS model) are specified syntax and characteristic value and create an amendment when a check result is NG and provided with fields of "inspection specification", "error number", and "correction specification".

The specified syntax and characteristic value about subparameters (such as Model_type, Polarity, . . . , Vref (refer to FIG. 29 and FIG. 30)) corresponding to the keyword (=[Model]) (refer to FIG. 29) for an IBIS file are described in "inspection specification". The error number when a syntax check result for an IBIS file is NG is described in "error number". The amendment when a check result is NG is described in "correction specification".

The check table 220 shown in FIG. 9 is a table used to check whether the syntax and characteristic value about a keyword (=[Pulldown] (refer to FIG. 30)) are specified syntax and characteristic value and create an amendment when a check result is NG and provided with fields of "inspection specification", "error number" and "correction specification".

The syntax and characteristic value of the rule about a keyword (=[Pulldown]) for an IBIS file are described in "inspection specification". The error number when a syntax check result for an IBIS is NG is described in "error number". The amendment when a check result is NG is described in "correction specification".

The check table 230 shown in FIG. 19 is a table used to check whether the syntax and characteristic value about a keyword (=[GND_clamp] (refer to FIG. 30)) are the specified syntax and characteristic value and create an amendment when a check result is NG, which is provided with fields of "inspection specification", "error number", and "correction specification".

The syntax and characteristic value of the rule about a keyword (for example, [GNG_clamp]) for an IBIS file are described in "inspection specification". The error number when a syntax check result for an IBIS file is NG is described in "error number". The amendment when a check result is NG is described in "correction specification". The storage section 30 also stores check tables (not shown) corresponding to other keywords ([Temperature Range] and [Voltage rang] and the like.

In FIG. 1, a keyword appearance frequency checking section 40 checks the keyword appearance frequency in an IBIS file according to the check tables 200 and 210. An appearance frequency error amendment creating section 50 creates an amendment according to the check tables 200 and 210 and the like when a keyword appearance frequency check result is NG.

A syntax checking section 60 executes the syntax check for an IBIS file according to the check tables 200 and 210 and the like. A syntax error amendment creating section 70 creates an amendment according to the check tables 200 and 210 and the like when a syntax check result is NG. A characteristic value checking section 80 executes the characteristic check for an IBIS file according to the check tables 200 and 210 and the like. A characteristic value amendment creating section 90 creates an amendment according to the check tables 200 and 210 and the like when a characteristic value check result is NG.

Figure 25:
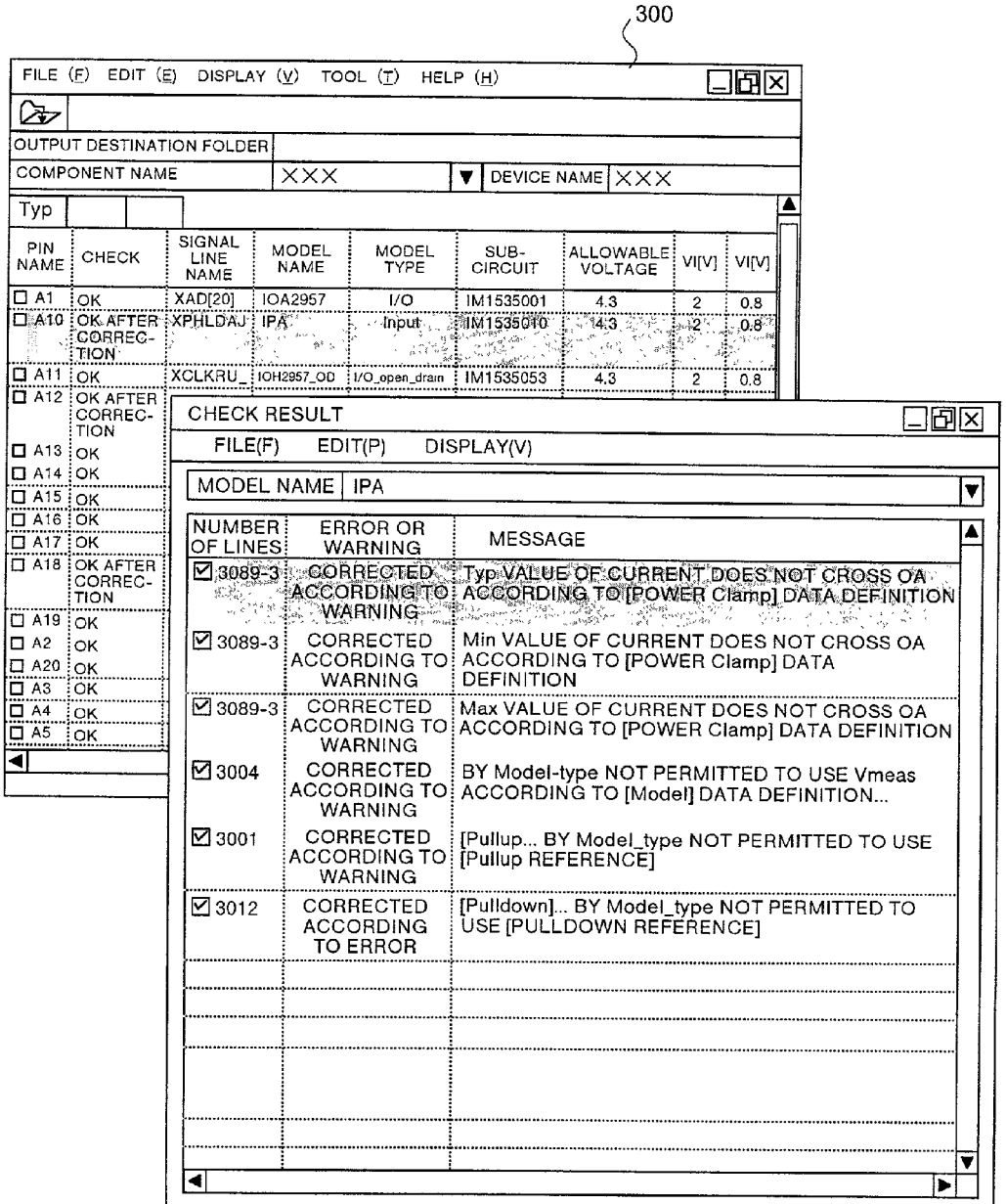
FIG. 25 is an illustration showing screens 300 and 310 of the embodiment shown in FIG. 1.
Figure 26:
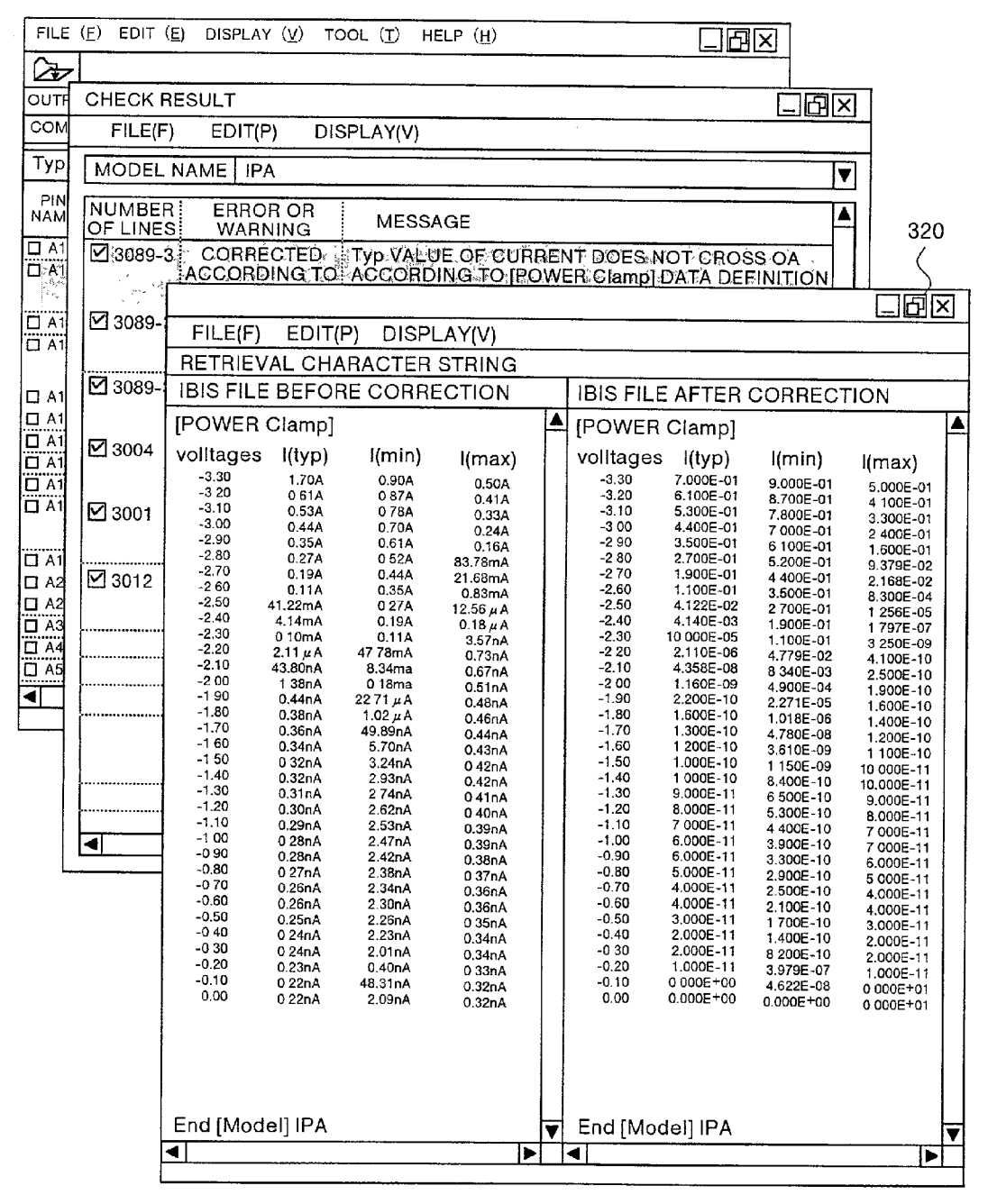
Figure 27:
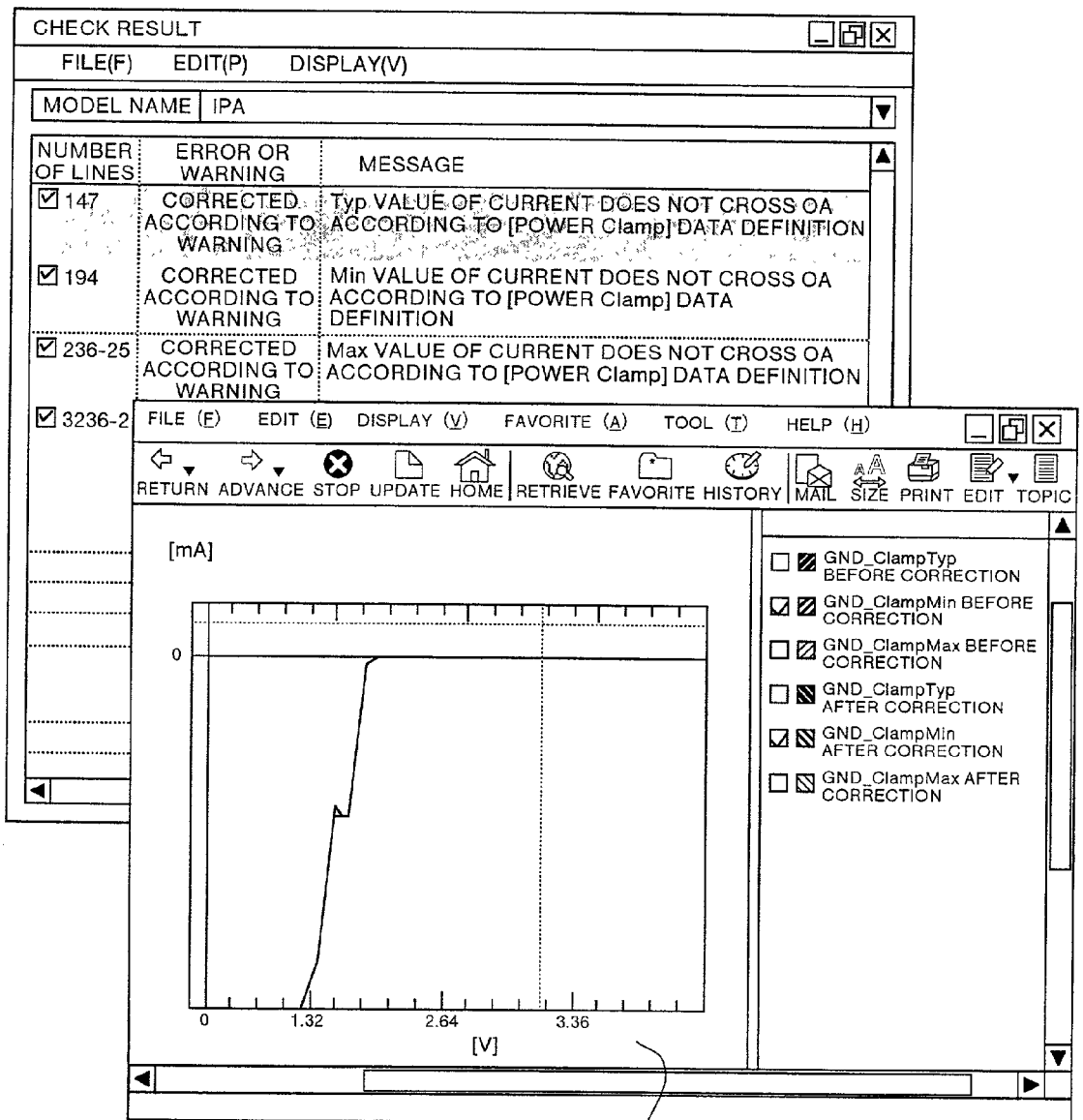
FIG. 27 is an illustration showing a screen 330 of the embodiment shown in FIG. 1.

A display section 100 uses a CRT (Cathode-Ray Tube) or an LCD (Liquid Crystal Display) or the like and displays screens 300, 310, 320 and 330 shown in FIGS. 25 to 27 respectively. These screens 300 and 310 and the like display such as IBIS file check results and various texts, and various graphs. Details of the screens 300 and 310 and the like will be described later.

A check result display controlling section 110 executes the control for displaying an IBIS file check result on the display section 100. A text display controlling section 120 executes the control for displaying various texts on the display section 100. A graph display controlling section 130 executes the control for displaying various graphs on the display section 100.

An amendment adoption-or-not determining section 140 executes the processing for making an operator determine whether to adopt amendments created by the appearance frequency error amendment creating section 50, syntax error amendment creating section 70, and characteristic value error amendment creating section 90. A finally corrected IBIS output section 150 outputs a finally corrected IBIS file. A bus 160 connects various sections each other.

Then, operations of the embodiment are explained below by referring to the flow chart shown in FIG. 2. In step SA1, the IBIS input section 10 inputs an IBIS file supplied from a semiconductor vendor to an electronic maker. The IBIS file is stored in the storage section 30. In step SA2, the keyword appearance frequency checking section 40 reads an IBIS file one line by one line from the storage section 30 and checks the keyword appearance frequency according to the check table 200 shown in FIG. 5.

Figure 3:
FIG. 3 is an illustration showing an IBIS file F01 of the embodiment shown in FIG. 1.

The following describes the keyword appearance frequency check when the IBIS file F01 shown in FIG. 3 is read in step SA1 in detail. The keyword appearance frequency checking section 40 reads the IBIS file F01 one line by one line to check the appearance of a keyword (=[Model]).

Then, when the keyword (=[Model]) appears, the keyword appearance frequency checking section 40 checks appearance frequencies of the keyword (=[Model]) and subparameters (=Model type, Polarity, . . . ) until the next keyword (=[Model]) appears. Moreover, the keyword appearance frequency checking section 40 checks whether an undefined subparameter is present in the IBIS file F01.

Moreover, the keyword appearance frequency checking section 40 stores the subparameter (=Model_type(=I/O)) shown in FIG. 3 in the storage section 30. Then, when the next keyword (=[Model]) appears, the keyword appearance frequency checking section 40 determines whether appearance frequencies of checked subparameters exceed the "specified permission frequency" corresponding to "subparameter" of the check table 200 shown in FIG. 5.

In this case, though the appearance frequency of a subparameter (=Vmeas) is twice in the IBIS file F01 shown in FIG. 3, the permission frequency of the "subparameter" (=Vmeas) of No. 8 shown in FIG. 5 is zero or one time. Therefore, a subparameter (=Vmeas=1.2V) appearing at the second time is overdefined (error).

Moreover, the IBIS file F01 shown in FIG. 3 is undefined (error) though the subparameter (=C_comp) of No. 7 shown in FIG. 5 is indispensable.

In step SA3, the appearance frequency error amendment creating section 50 determines whether an error is present in step SA2. When the determination result is "No", the processing in step SA5 is executed. In this case, because the overdefined error and undefined error occur in step SA2, the appearance frequency error amendment creating section 50 sets the determination result in step SA3 to "Yes".

In step SA4, the appearance frequency error amendment creating section 50 applies an amendment of deleting the overdefined subparameter (=Vmeas=1.2V) to the IBIS file F01a for temporary correction shown in FIG. 4 (in FIG. 4, "comment out": deletion) according to the "correspondence to case of defining frequency exceeding specified frequency" of No. 8 in the check table 200 shown in FIG. 5. The IBIS file F01a is stored in the storage section 30.

Then, the appearance frequency error amendment creating section 50 stores an error occurrence line number of the IBIS file F01 (in this case, line number of Vmeas=1.2V), a temporary correction line number of the IBIS file F01a corresponding to the error occurrence number, and the information of an error code obtained from a not-shown error code table in the storage section 30 as error logs about undefined errors. The error code is a code showing an overdefined error.

Then, the appearance frequency error amendment creating section 50 applies an amendment of adding a typical value of a subparameter (=C_comp) to the IBIS file F01 to the IBIS file F01a for temporary correction shown in FIG. 4 according to "correspondence to undefined case" of No. 7 in the check table 200 (in FIG. 4, "addition of typical value").

Then, the appearance frequency error amendment creating section 50 stores an error occurrence line number (in this case, line number between variable and [Temperature Range]) of the IBIS file F01, a temporary correction line number of the IBIS file F01a corresponding to the error occurrence line number, and the information of an error code in the storage section 30 as error logs. The error code is a code showing an undefined error.

In step SA5, the syntax checking section 60 reads an IBIS file from the storage section one line by one line and executes the each keyword syntax checking process every keyword (for example, [Model]).

The each keyword syntax checking process when the IBIS file F02 shown in FIG. 7 is read in step SA1 is described below in detail. The syntax checking section 60 reads the IBIS file F02 one line by one line. When a keyword (=[Model]) appears, the syntax checking section 60 checks the syntax of the keyword (=[Model]) and subparameters (=Model_type, Polarity, . . . ) according to the check table 210 (for keyword (=[Model])) shown in FIG. 6.

In this case, it is decided as specified syntax that vinl and vinh are numerical values in "inspection specification" in Item 7 shown in FIG. 6. However, the subparameter (=Vinl=0.7V) in the IBIS file F02 shown in FIG. 7 is a syntax error because the parameter includes the alphabet O.

Moreover, in "inspection specification" in Item 9 shown in FIG. 6, it is decided that the typ value of C_comp is a numerical value. However, the subparameter (=C_comp=NA) in the IBIS file F02 shown in FIG. 7 is a syntax error because the parameter is shown by a character string NA.

In step SA6, the syntax error amendment creating section 70 determines in step SA5 whether an error is present. When the determination result is "No", the processing in step SA8 is executed. In this case, because the error occurs in step SA6, the syntax error amendment creating section 70 sets the determination result in step SA6 to "Yes".

In step SA7, the syntax error amendment creating section 70 applies an amendment of deleting the subparameter (=Vinl=0.7V) to the IBIS file F02a for temporary correction shown in FIG. 8 (in FIG. 8, "comment out": deletion) according to "correction specification" in Item 7 in the check table 210 shown in FIG. 6 about the syntax error that the alphabet O is included in the subparameter (=Vinl=0.7V) shown in FIG. 7. The IBIS file F02a is stored in the storage section 30.

Then, the syntax error amendment creating section 70 stores an syntax error occurrence line number (in this case, line number of Vinl=0.7V) of the IBIS file F02, a temporary correction line number of the IBIS file F02a corresponding to the line number, and the information-of an error code in the storage section 30 as error logs about the syntax error. The error code is a code showing the syntax error.

Then, the syntax error amendment creating section 70 applies an amendment of changing the character string NA of the subparameter (=C_comp) to a typical value according to "correction specification" in Item 9 of the check table 210 shown in FIG. 6 about the syntax error that typ value of C_comp is the character string NA to the IBIS file F02a for temporary correction shown in FIG. 8 (in FIG. 8, "type value is changed to typical value").

Then, the syntax error amendment creating section 70 stores an error occurrence line number (in this case, line number of C_comp) of the IBIS file F02, a temporary correction line number of the IBIS file F02a corresponding to the line number, and the information of an error code in the storage section 30 as error logs. The error code is a code showing the syntax error.

Moreover, as another example of syntax check, syntax check when the IBIS file F03 shown in FIG. 10 is read in step SA1 is described below in detail. The syntax checking section 60 reads the IBIS file F03 one line by one line. When a keyword (=[Model]) appears, the syntax checking section 60 checks the syntax about a keyword (=[Pulldown]) according to the check table 220 (for keyword (=[Pulldown]) shown in FIG. 9.

In this case, though it is decided as a specified syntax in "inspection specification" in Item 9 shown in FIG. 9 that the number of numerical data value sets (typ) other than the character string NA about the keyword (=[Pulldown]) ranges 2 and 100 sets, the number of numerical data sets about the keyword (=[Pulldown]) in the IBIS file F03 shown in FIG. 10 is decided as 102 sets. Therefore, this is a syntax error. That is, in the case of the example shown in FIG. 10, two sets of numerical data values are in excess.

In step SA6, the syntax error amendment creating section 70 determines whether an error is present in step SA5. In this case, the section 70 sets the determination result to "Yes". In step SA7, the syntax error amendment creating section 70 applies an amendment of changing a set of numerical data values (0.201506, 0.121221, and 0.307612) on the first line from the bottom and a set of numerical data values (0.201063, 0.120931 and 0.306966) on the third line from the bottom shown in FIG. 11 to a character string NA according to "correction specification" in Item 9 in the check table 220 shown in FIG. 9 about the syntax error to the IBIS file F03a for temporary correction shown in FIG. 11. The IBIS file F03a is stored in the storage section 30.

Then, the syntax error amendment creating section 70 stores syntax error occurrence line numbers (first line number and third line number from the bottom) in the IBIS file F03, temporary correction line numbers in the IBIS file F03a corresponding to the line numbers, and the information of error codes of the line numbers in the storage section 30 as error logs about the syntax error. These error codes are codes respectively showing the syntax error of each of the line numbers.

Figure 2:
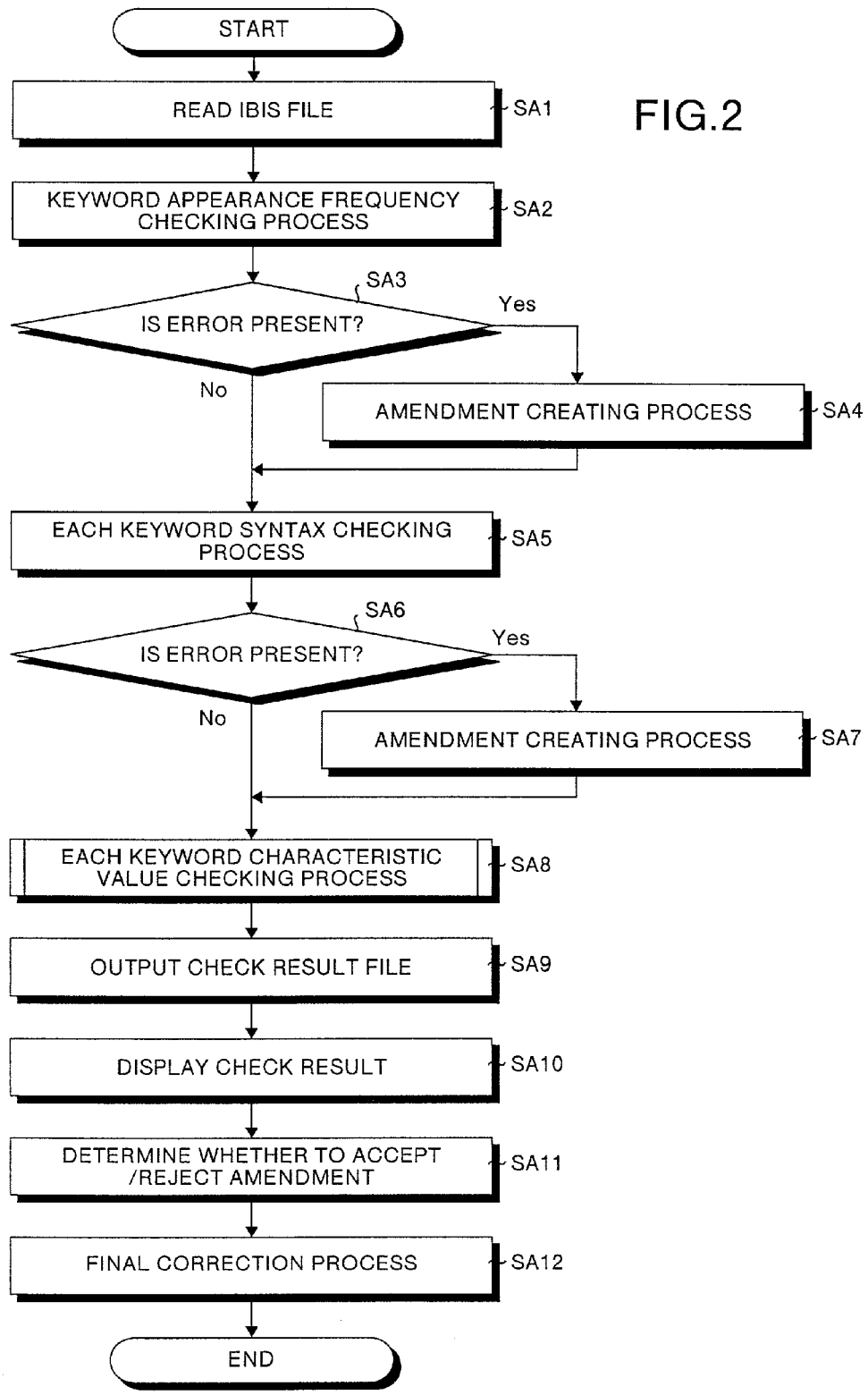
FIG. 2 is a flow chart for explaining operations of the embodiment shown in FIG. 1.

In step SA8 shown in FIG. 2, the characteristic value checking section 80 executes each keyword characteristic value check for checking a characteristic value for each keyword of an IBIS file. Specifically, in step SB1 shown in FIG. 12, the characteristic value checking section 80 reads an IBIS file from the storage section 30 one line by one line to check whether the various size relation between characteristic values is correctly defined every keyword.

Hereafter, checking of whether typ value, min value, and max value of [Model] as keyword, and [C_comp] as characteristic values (refer to FIG. 29) are kept in the relation of min value $\leq$ typ value $\leq$ max value is described in detail. In this case, it is assumed that the following characteristic values are defined for [C_comp].

|  |  | typ | min | Max |
|---|---|---|---|---|
| Before correction | [C_comp] | 10 | 15 | 20 |

In this case, the characteristic value checking section 80 determines the relation of typ value (=10)<min value (=15) as a various size relation error according to Item 11 in the check table 210 shown in FIG. 6. In step SB2, the characteristic value error amendment creating section 90 determines whether the check result in step SB1 is OK. When the determination result is "Yes", the processing in step SB4 is executed. In this case, the characteristic value error amendment creating section 90 sets the determination result in step SB2 to "No".

In step SB3, the characteristic value error amendment creating section 90 applies an amendment of replacing the typ value (=10) and min value (=15) of [C_comp] in the normal order as shown below to an IBIS file for temporary correction (not shown).

|  |  | typ | min | Max |
|---|---|---|---|---|
| After correction | [C_comp] | 10 | 15 | 20 |

Then, the characteristic value error amendment creating section 90 stores a various size relational error occurrence line number of an IBIS file, a temporary correction number of an IBIS file for temporary correction corresponding to the number, and the information for an error code in the storage section 30 as error logs about the various size relation. The error code is a code showing the various size relation.

In step SB4, the characteristic value checking section 80 reads an IBIS file from the storage section 30 one line by one line to check whether the typ value serving as a characteristic value corrected in step SB3 is kept in a predetermined numerical value range.

In this case, the characteristic value checking section 80 determines the corrected typ value (=15) as a typ value error according to Item 12 in the check table 210 shown in FIG. 6 because the value is out of a predetermined numerical value range (for example, 0 to 10). In step SB5, the characteristic value error amendment creating section 90 determines whether the check result in step SB4 is OK. When the determination result is "Yes", the processing in step SB7 is executed. In this case, the characteristic value error amendment creating section 90 sets the determination result in step SB5 to "No".

In step SB6, the characteristic value error amendment creating section 90 changes the typ value (=15) of [C_comp] to a previously defined typical value (for example, 5) and applies an amendment of changing the min value and max value to a character string NA to an IBIS file for temporary correction (not shown).

|  |  | typ | min | max |
|---|---|---|---|---|
| After correction | [C_comp] | 5 | NA | NA |

Then, the characteristic value error amendment creating section 90 stores a typ value error occurrence line number of an IBIS file, a temporary correction line number of an IBIS file for temporary correction corresponding to the line number, and the information of an error code in the storage section 30 as error logs about the typ value error. The error code is a code showing the typ value error.

In step SB7, the characteristic value checking section 80 reads an IBIS file from the storage section 30 one line by one line to check according to a check table whether the min value and max value serving as characteristic values of [C_comp] are kept in a predetermined numerical value range.

In this case, it is assumed that the following characteristic values are defined for [C_comp].

|  |  | Typ | min | max |
|---|---|---|---|---|
| Before correction | [C_comp] | 8 | 5 | 20 |

The characteristic value checking section 80 determines the max value (=20) as a max value error according to Item 13 in the check table 210 shown in FIG. 6 because it is out of a predetermined numerical value range (for example, 0 to 10). In step SB8, the characteristic value error amendment creating section 90 determines whether the check result in step SB7 is OK. When the determination result is "Yes", the processing in step SB8 is executed. In this case, the characteristic value error amendment creating section 90 sets the determination result in step SB8 to "No".

In step SB9, the characteristic value error amendment creating section 90 applies an amendment of changing a value (in this case, max value) when a check result is NG as shown below to a character string NA to an IBIS file for temporary correction (not shown).

|  | typ | min | max |
|---|---|---|---|
| After correction [C_comp] | 8 | 5 | NA |

Then, the characteristic value error amendment creating section 90 stores a max value occurrence line number of an IBIS file, a temporary correction line number of an IBIS file for temporary correction corresponding to the line, and the information of an error code in the storage section 30 as error logs about the errors. The error code is a code showing the max value error.

Moreover, as another example, a case of checking [Ramp] as a keyword and dV/dt_f as a characteristic value is described below by referring to FIGS. 13 and 14. In this case, in step SB4, the characteristic value checking section 80 reads the IBIS file F04 shown in FIG. 13 from the storage section 30 one line by one line to check whether the typ value serving as a characteristic value corrected in step SB3 is kept in a predetermined numerical value range according to the following check table.

| | Check table about [ramp] | | |
|---|---|---|---|
| Item | Inspection specification | Error number | Correction specification |
| 6 | Is typ value of dV/dt_f a positive value other than 0? | CE88 | When value of dV is not positive value, change value of dV to value obtained from Pulldown and R_load. |
| 7 | Are min and max values of dV/dt_f positive value other than 0? | | Change to NA. |

In this case, the characteristic value checking section 80 determines the typ value (dV) of dV/dt_f of the keyword (=[ramp]) in FIG. 13 as a typ value error according to Item 6 in the check table because the typ value (dV) is equal to 0.0000E+00. In step SB5, the characteristic value error amendment creating section 90 sets the determination result to "No".

Figure 15:
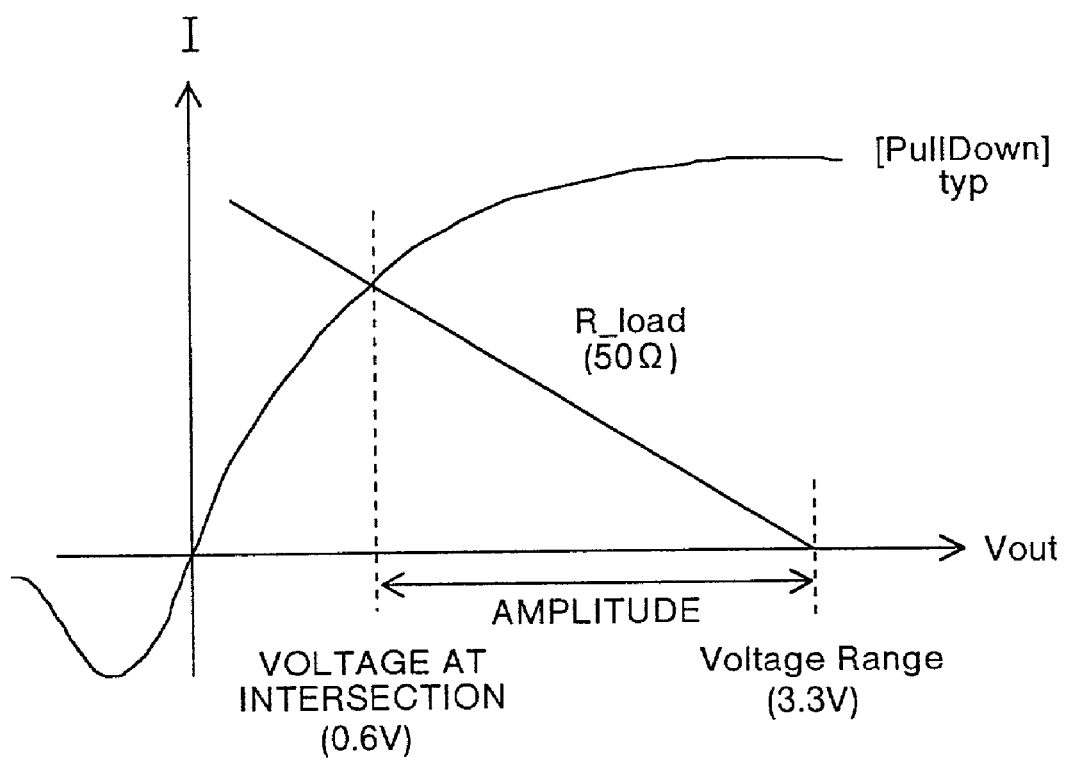
FIG. 15 is an illustration for explaining the each keyword characteristic value check shown in FIG. 2.

In step SB6, the characteristic value error amendment creating section 90 plots V/I characteristics in [Pulldown] shown in FIG. 13, that is, Voltage and I (typ) as shown in FIG. 15. In FIG. 15, x-axis corresponds to the Voltage and y-axis corresponds to I (typ). Then, in the graph shown in FIG. 15, the characteristic value error amendment creating section 90 draws a straight line of the load R_load (when there is no definition in an IBIS file, 50 Ω is used) from [Voltage Range]=3.3 V shown in FIG. 13 to obtain the difference between the voltage at the intersection (=0.6V) and the [Voltage Range]=3.3V as a voltage amplitude (=2.7V).

Then, the characteristic value error amendment creating section 90 applies an amendment of changing the typ value (dt) of [dV/dt_f] shown in FIG. 13 to the value equal to 60% of the voltage amplitude (2.7×0.6=1.62V) to the IBIS file F04a for temporary correction shown in FIG. 14.

Then, the characteristic value error amendment creating section 90 stores a typ value error occurrence line number of the IBIS file F04, a temporary correction line number of the IBIS file F04a for temporary correction corresponding to the line, and the information of an error code in the storage section 30 as error log about the type value error. The error code is a code showing the type value error.

In step SB7, the characteristic value checking section 80 reads the IBIS file F04 shown in FIG. 13 from the storage section 30 one line by one line to check min and max values serving as characteristic values of the [ramp] according to the check table about the [ramp].

In this case, the characteristic value checking section 80 determines min and max values as min value and max value errors because dV of the min value and that of the max value respectively show 0.0000E+00. In step SB8, the characteristic value error amendment creating section 90 sets the determination result to "No".

In step SB9, the characteristic value error amendment creating section 90 applies an amendment of changing the min and max values of [dV/dt_f] shown in FIG. 13 to a character string NA to the IBIS file F04a for temporary correction shown in FIG. 14.

Then, the characteristic value error amendment creating section 90 stores the min value and max value errors occurrence line number of the IBIS file F04, a temporary correction line number of the IBIS file F04a corresponding to the line number, and the information of error codes in the storage section 30 as error logs about the min value and max value errors. The error codes are codes showing the min value and max value errors.

In step SB10 shown in FIG. 12, the characteristic value checking section 80 reads an IBIS file from the storage section 30 one line by one line to check whether the data range of characteristic values is properly defined according to a check table. The case of [GND_clamp] shown in FIG. 16 is described below.

In this case, the characteristic value checking section 80 determines a data range error because a voltage is defined to be 3.3 V or higher and −3.3 V or lower in Items 5 and 6 of the check table 230 (for [GND_clamp]) shown in FIG. 19 but the voltage (=Voltage) of [GND_clamp] shown in FIG. 16 ranges between −0.6V and 3.3V. That is, in the case of the example shown in FIG. 16, voltages from −3.3 V up to −0.6V are undefined.

In step SB11, the characteristic value error amendment creating section 90 determines whether the check result in step SB10 is OK. When the determination result is "Yes", the processing in step SB13 is executed. In this case, the characteristic value error amendment creating section 90 sets the determination result in step SB11 to "No".

Figure 18:
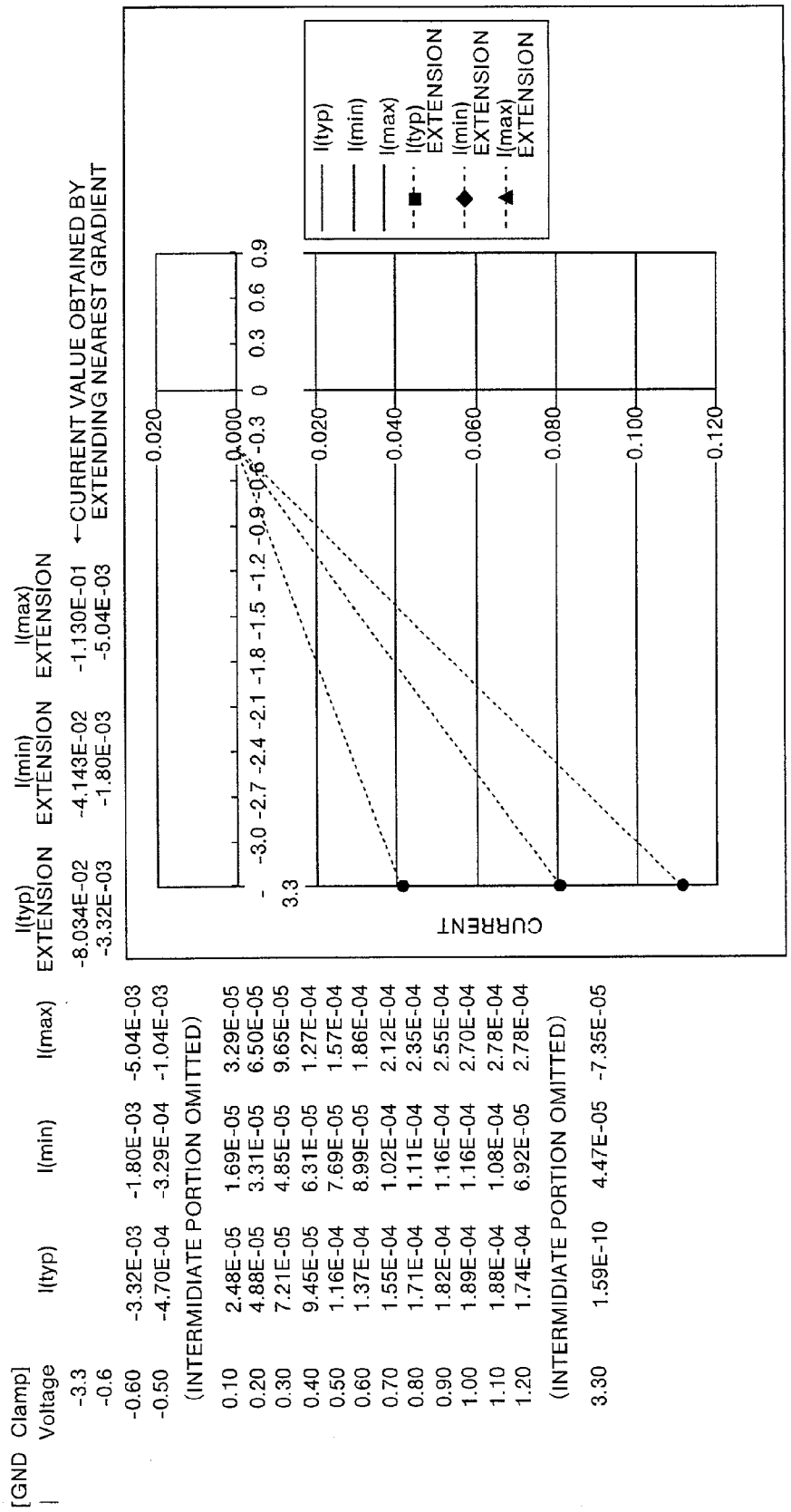
FIG. 18 is an illustration for explaining the data range checking process shown in FIG. 12.

In step SB12, the characteristic value error amendment creating section 90 obtains gradients between two points of current I (typ), current I (min), and current I (max) corresponding to Voltage=−0.6V and −0.5V shown in FIG. 16. Then, as shown in FIG. 18, the characteristic value error amendment creating section 90 extends the current I (typ), current I (min), and current I (max) according to the gradients of them, obtains current I (typ), current I (min) and current I (max) corresponding to voltage=−3.3V, and applies an amendment of interpolating these currents to the IBIS file F05a for temporary correction shown in 17.

Then, the characteristic value error amendment creating section 90 stores an error occurrence line number of the IBIS file F05, a temporary correction line number of the IBIS file F05a corresponding to the line number, and the information of an error code in the storage section 30 as error logs about the data range error. The error code is a code showing the data range error.

In step SB13, the characteristic value checking section 80 reads an IBIS file from the storage section 30 one line by one line to check whether a characteristic value monotonously increases or decreases according to a check table. The case of [GND_clamp] shown in FIG. 20 is described below in detail.

In this case, the characteristic value checking section 80 executes monotonous increase/decrease check according to Item 11 of the check table 230 (for [GND_clamp]) shown in FIG. 19. Specifically, the characteristic value checking section 80 determines the entire increase/decrease direction according to the V/I characteristic shown in FIG. 20, that is, both-end data values of Voltage and I (typ).

|  | Voltage | I (typ) |
|---|---|---|
| First data (Fifth line) | 3.30 | 0.0 mA |
| First data (Fifty-third line) | −3.30 | −150.10 mA |

In the case of the above example, the characteristic value checking section 80 determines that both voltage and current tend to decrease. Then, as shown in FIG. 22, the characteristic value checking section 80 checks whether the voltage monotonously increases and decreases toward the both sides from a start point which is the closest point.

Then, as shown in FIG. 22, the characteristic value checking section 80 check whether the voltage monotonously increases or decreases toward the direction from in which the voltage rises from the start point. In this case, when the current increase/decrease direction between a noticed point and the next point is opposite to the whole increase/decrease direction, the characteristic value checking section 80 sets a monotonous increase/decrease result to NG.

Instep SB14, the characteristic value error amendment creating section 90 determines whether the check result in step SB13 is OK. When the determination result is "Yes", the section 90 executes the processing in step SB16.

However, when the determination result in step SB14 is "No", the section 90 executes the processing for correcting an error according to the following conditions 1 and 2. Though the start point shown in FIG. 22 serves as a first noticed point, a current change from the preceding point is assumed as 0.

(Condition 1) Current change between noticed point and preceding point<current change between noticed point and next point
  Correct the current value at the next point to the current value at the noticed point.
(Condition 2) Current change between noticed point and preceding point>Current change between noticed point and next point
  Correct the current value at the noticed point to the next current value.

For example, when checking is performed toward the direction in which a voltage rises from a start point, this case corresponds to the (condition 1) as described below. Therefore, the fifth-line current I (typ) is corrected as shown below.

|  | Voltage | I (typ) |
|---|---|---|
| Sixth-line data (Noticed point) | 0.00 | 5.242E−07 |
| Fifth-line data (Next point) | 3.30 | 0.0 mA |
| Fifth-line data (After correction) | 3.30 | 5.242E−07 |

Then, the characteristic value error amendment creating section 90 applies an amendment of correcting data so that it monotonously increases or decreases to the IBIS file F06 for temporary correction shown in FIG. 21. Then, the section 90 stores an error occurrence line number of the IBIS file F06, a temporary correction line number of the IBIS file F06a corresponding to the line number, and the information of an error code in the storage section 30 as error logs about the monotonous increase/decrease error. The error code is a code showing the monotonous increase/decrease error.

In step SB16, the characteristic value checking section 80 reads an IBIS file from the storage section 30 one line by one line to check whether a current value crosses OA serving as a reference point according to a check table. The case of [GND_clamp] shown in FIG. 23 is described below in detail.

In this case, the characteristic value checking section 80 executes the reference point crosscheck process. Specifically, the characteristic value checking section 80 sequentially checks whether the current I (typ), current I (min), and current I (max) shown in FIG. 23 cross OA (reference point) in the direction from minimum voltage to maximum voltage.

In this case, because the current I (typ), current I (min), and current I (max) are all negative, a reference point crosscheck result is NG. In step SB17, the characteristic value error amendment creating section 90 determines whether the check result in step SB16 is OK and in this case, sets the determination result to "No".

In step SB18, the characteristic value error correction plan creating section 90 applies an amendment of translating all current values so that I (typ)=−15.5969e-6 closest to 0A among the current values shown in FIG. 23 becomes 0 to the IBIS file F07a for temporary correction shown in FIG. 24. Then, the characteristic value error amendment creating section 90 stores an error occurrence line number of the IBIS file F07, a temporary correction line number of the IBIS file F07a for temporary correction corresponding to the line number, and the information of an error code in the storage section 30 as error log about the reference point cross error. The error code is a code showing the reference point cross error.

In step SA9 in FIG. 2, the controlling section 20 an IBIS file for temporary correction, an error log, and an IBIS file to be corrected to a check result display controlling section 110, a text display controlling section 120, and a graph display controlling section 130 from the storage section 30 as check result files.

In step SA10, the screen 310 (check result) shown in FIG. 25 is displayed on a display section 100 under controls by the check result display controlling section 110 and text display controlling section 120. Various check results above described are displayed on the screen 310. In step SA11, an amendment acceptance/rejection determining section 140 determines whether to accept or reject an amendment by making an operator check a check box of the screen 310 when accepting an amendment of the device.

In step SA12, a finally corrected IBIS output section 150 finally reflects an amendment checked by the operator on an IBIS file and outputs the corrected IBIS file. Thereby, the screen 300 showing the final correction result shown in FIG. 25 is displayed on the display section 100. Moreover, the screen 320 shown in FIG. 26 is also displayed on the display section 100 according to operator's operations.

An IBIS file to be corrected and a corrected IBIS file are simultaneously displayed on the screen 320 and thereby, it is possible to compare the both files. Moreover, the screen 330 shown in FIG. 27 is displayed on the display section 100 through operator's operations. An IBIS file to be corrected and a corrected IBIS file are displayed on the screen 330.

As described above, according to this embodiment, a device model is checked according to the check tables 200 and 210 and the like showing the relation between the description rule. (including syntax and keyword appearance frequency) of the device model and an amendment when deviating from the description rule and corrected according to the amendment when a description deviating from the description rule is checked. Therefore, it is possible to quickly and accurately check the description rule of a device model and correct a corresponding defective section without depending on the user skill.

Moreover, the data showing electrical characteristics of a device model are checked according to the electrical characteristic tables 210 and 220 and the like showing the relation between the normal electrical characteristic (characteristic value) of the device model and an amendment when deviating from the normal electrical characteristic and corrected according to a corresponding amendment when the data deviating from the electrical characteristics. Therefore, it is possible to quickly and accurately check the data about electrical characteristics of the device model and correct a corresponding defective section.

Moreover, a device model is corrected by interpolating the data included in the device model when the data deviating from the electrical characteristics (characteristic values) is present as shown in FIG. 18. Therefore, it is possible to correct the device model by effectively using existing data.

Furthermore, when the data deviating from electrical characteristics (characteristic values) is present, the device model is corrected by deleting the data. Therefore, it is possible to correct the device model by an extremely simple method.

Furthermore, the device model is corrected according to an amendment corrected and approved by an operator by using the screen 310 shown in FIG. 25. Therefore, it is possible to improve correction accuracy compared to the case of full automatic correction.

Furthermore, a device model to be corrected and a corrected device model are displayed for comparison according to the screen 320 shown in FIG. 26. Therefore, it is possible for an operator to clearly detect a correction section.

Furthermore, electrical characteristics (characteristic value) of a device model before correction and electrical characteristics (characteristic value) of a device model after correction are displayed for comparison through graphics on the screen 330 shown in FIG. 27. Therefore, it is possible for an operator to clearly and visually detect a correction section.

An embodiment of the present invention is described above in detail by referring to the accompanying drawings. A specific configuration is not limited to the above embodiment. Design modifications are included in the present invention as long as the modifications are not deviated from the summary of the present invention.

Figure 28:
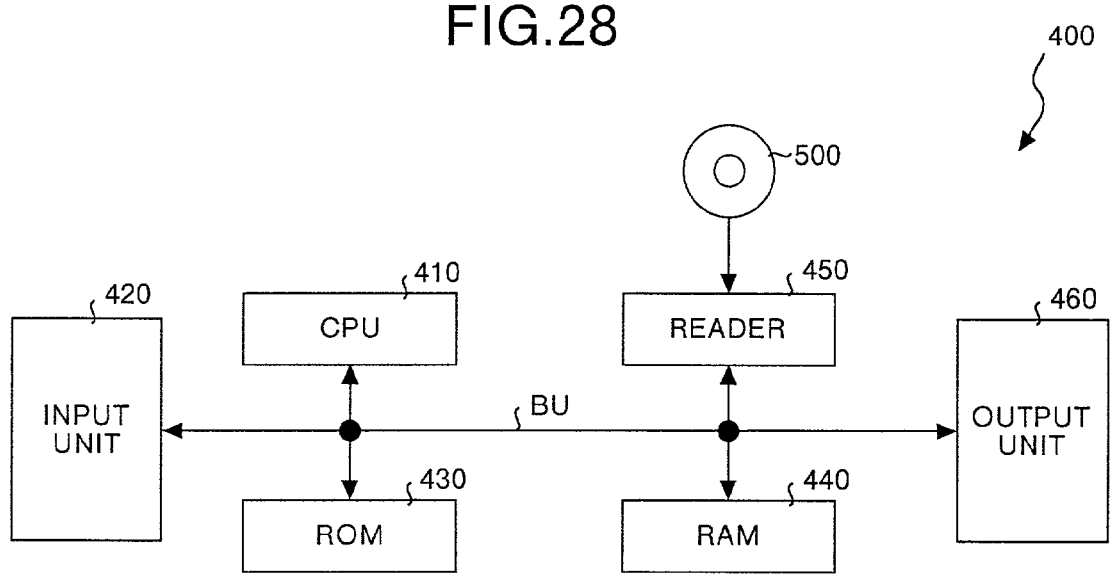
FIG. 28 is a block diagram showing a modification of the embodiment shown in FIG. 1.

For example, in the case of the embodiment, it is also permitted to execute a series of processing about automatic correction of a device model by recording an automatic device model correcting program for realizing the function of the automatic device model correcting apparatus in the computer readable recording medium 500 shown in FIG. 28 and making the computer 400 shown in FIG. 28 read and execute the automatic device model correcting program recorded in the recording medium 500.

The computer 400 shown in FIG. 28 is constituted of a CPU 410 for executing the automatic device model correcting program, an input unit 420 including such as a keyboard and a mouse, a ROM (Read Only Memory) 430 for storing various data values, a RAM (Random Access Memory) 440 for storing operation parameters and the like, a reader 450 for reading an automatic device model correcting program from the recording medium 500, an output unit 460 including such as a display and a printer, and a bus BUS for connecting various sections.

The CPU 410 executes a series of processing about automatic correction of a device model described above by reading an automatic device model correcting program from the recording medium 500 via the reader 450 and then executing the program. The recording medium 500 includes not only portable recording media such as an optical disk, floppy disk, and hard disk but also a transmission medium for temporarily holding data such as a network.

As described above, according to one aspect of this invention, the description rule of a device model is checked according to a description rule table showing the relation between the description rule of the device model and an amendment when deviating from the description rule and corrected according to the amendment when a description deviating from the description rule is checked. Therefore, an advantage is obtained that it is possible to quickly and accurately check the data about electrical characteristics of a device model and correct a corresponding defective section.

Furthermore, the data showing electrical characteristics of a device model is checked according to an electrical characteristic table showing the relation between the normal electrical characteristic of the device model and an amendment when deviating from the normal electrical characteristic and corrected according to a corresponding amendment when data deviating from electrical characteristics is present. Therefore, an advantage is obtained that it is possible to quickly and accurately check the data about electrical characteristics of the device model and correct a corresponding defective section.

Furthermore, when the data deviating from an electrical characteristic is present in a step of checking electrical characteristic data, a device model is corrected by interpolating the data included in the device model. Therefore, an advantage is obtained that it is possible to correct the device model by effectively using existing data.

Furthermore, when the data deviating from an electrical characteristic is present in a step of checking electrical characteristic data, the device model is corrected by deleting the data. Therefore, an advantage is obtained that it is possible to correct the device model by an extremely simple method.

Furthermore, the device model is corrected according to an amendment corrected and approved by an operator. Therefore, an advantage is obtained that it is possible to improve correction accuracy compared to the case of full automatic correction.

Furthermore, a device model before correction and a device model after correction are displayed for comparison. Therefore, an advantage is obtained that an operator can clearly detect a correction section.

Furthermore, electrical characteristics of a device model before correction and electrical characteristics of a device model after correction are displayed for comparison. Therefore, an advantage is obtained that an operator can visually and clearly detect a correction section.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer program containing instructions which when executed on a computer realize a method comprising:
   checking a description of a device model for a semiconductor device to determine if the description of the device model complies with a description rule for an electrical characteristic, the device model being checked against a description rule table that stores the description rule and a proposed amendment corresponding to the description rule when the description deviates from the description rule; and
   correcting the description of the device model according to a corresponding proposed amendment in the description rule table when the description deviates from the description rule.

2. The computer program according to claim 1 containing instructions which when executed on a computer further realize checking the data showing the electrical characteristic of the device model according to an electrical characteristic table showing the relation between the normal electrical characteristic of the device model and an amendment when deviating from the electrical characteristic is included,
   wherein the device model is corrected according to a corresponding amendment when data deviating from the electrical characteristic is present.

3. The computer program according to claim 2, wherein when data deviating from the electrical characteristic is present, a device model is corrected according to a corresponding amendment by interpolating the data included in the device model.

4. The computer program according to claim 2, wherein when data deviating from the electrical characteristic is present, the device model is corrected by deleting the data.

5. The computer program according to claim 1, wherein the device model is corrected according to an amendment correction approved by an operator.

6. The computer program according to claim 1 containing instructions which when executed on a computer further realize comparing and displaying a device model to be corrected and a corrected device model.

7. The computer program according to claim 1 containing instructions which when executed on a computer further realize comparing and displaying the electrical characteristic of a device model to be corrected and that of a corrected device model through graphics.

8. An automatic device model correcting apparatus, comprising:
   a description rule checking unit which checks a description of a device model for a semiconductor device to determine if the description of the device model complies with a description rule for an electrical characteristic, the device model being checked against a description rule table that stores the description rule and a proposed amendment corresponding to the description rule when the description deviates from the description rule; and
   a correcting unit which corrects the description of the device model according to a corresponding proposed amendment in the description rule table when the description deviates from the description rule checked by said description rule checking unit.

9. An automatic device model correcting method, comprising:
   checking a description of a device model for a semiconductor device to determine if the description of the device model complies with a description rule for an electrical characteristic, the device model being checked against a description rule table that stores the description rule and a proposed amendment corresponding to the description rule when the description deviates from the description rule; and
   correcting the description of the device model according to a corresponding proposed amendment in the description rule table when the description deviates from the description rule.

10. A method of operating a data processing system, comprising:
    identifying a portion of a semiconductor circuit simulation device model that violates a predefined rule; and
    automatically correcting the portion by applying a predefined model amendment associated with the rule.

11. A computer program containing instructions which when executed on a computer realize a method comprising:
    checking a circuit simulation device model against a description rule table that contains rules for how the device model is to be described with regard to the electrical characteristics of the device, the description rule table also containing proposed amendments for when the device model is not described according to the rules, the proposed amendments correcting a portion of the device model for which the device model is not described according to the rules; and
    correcting the device model according to at least one corresponding proposed amendment when the device model is not described according to the rules.

* * * * *